(12) United States Patent
Tateoka et al.

(10) Patent No.: US 7,733,187 B2
(45) Date of Patent: Jun. 8, 2010

(54) HIGH FREQUENCY POWER AMPLIFIER

(75) Inventors: Kazuki Tateoka, Kyoto (JP); Masahiko Inamori, Osaka (JP); Haruhiko Koizumi, Osaka (JP)

(73) Assignee: Panasonic Corporation, Osaka (JP)

( * ) Notice: Subject to any disclaimer, the term of this patent is extended or adjusted under 35 U.S.C. 154(b) by 34 days.

(21) Appl. No.: 11/870,100

(22) Filed: Oct. 10, 2007

(65) Prior Publication Data

US 2008/0088376 A1    Apr. 17, 2008

(30) Foreign Application Priority Data

Oct. 13, 2006    (JP)    ............... 2006-279513

(51) Int. Cl.
*H03F 3/191* (2006.01)
(52) U.S. Cl. .................. 330/302; 330/307
(58) Field of Classification Search ........... 330/302, 330/307, 277, 286
See application file for complete search history.

(56) References Cited

U.S. PATENT DOCUMENTS 6,081,694 A * 6/2000 Matsuura et al. ............... 455/78

6,281,748 B1    8/2001 Klomsdorf et al.
2003/0076174 A1 * 4/2003 Tanoue et al. ............... 330/302

FOREIGN PATENT DOCUMENTS

JP    2001-251202 A    9/2001

* cited by examiner

*Primary Examiner*—Robert Pascal
*Assistant Examiner*—Hieu P Nguyen
(74) *Attorney, Agent, or Firm*—RatnerPrestia

(57) ABSTRACT

A small, high performance high frequency power amplifier enables easily adjusting and switching the impedance. The high frequency power amplifier module includes a first semiconductor chip including one or a plurality of high frequency amplification devices, and a second semiconductor chip including one or more high frequency matching circuit devices and one or more switching devices. The second semiconductor chip includes the matching circuit for a high frequency amplifier device. The second semiconductor chip also includes a circuit composed of a capacitance and a switching device connected in series or parallel to the capacitance. The switching device switches on or off so that the capacitance is connected or is not connected as a part of the matching circuit.

13 Claims, 25 Drawing Sheets

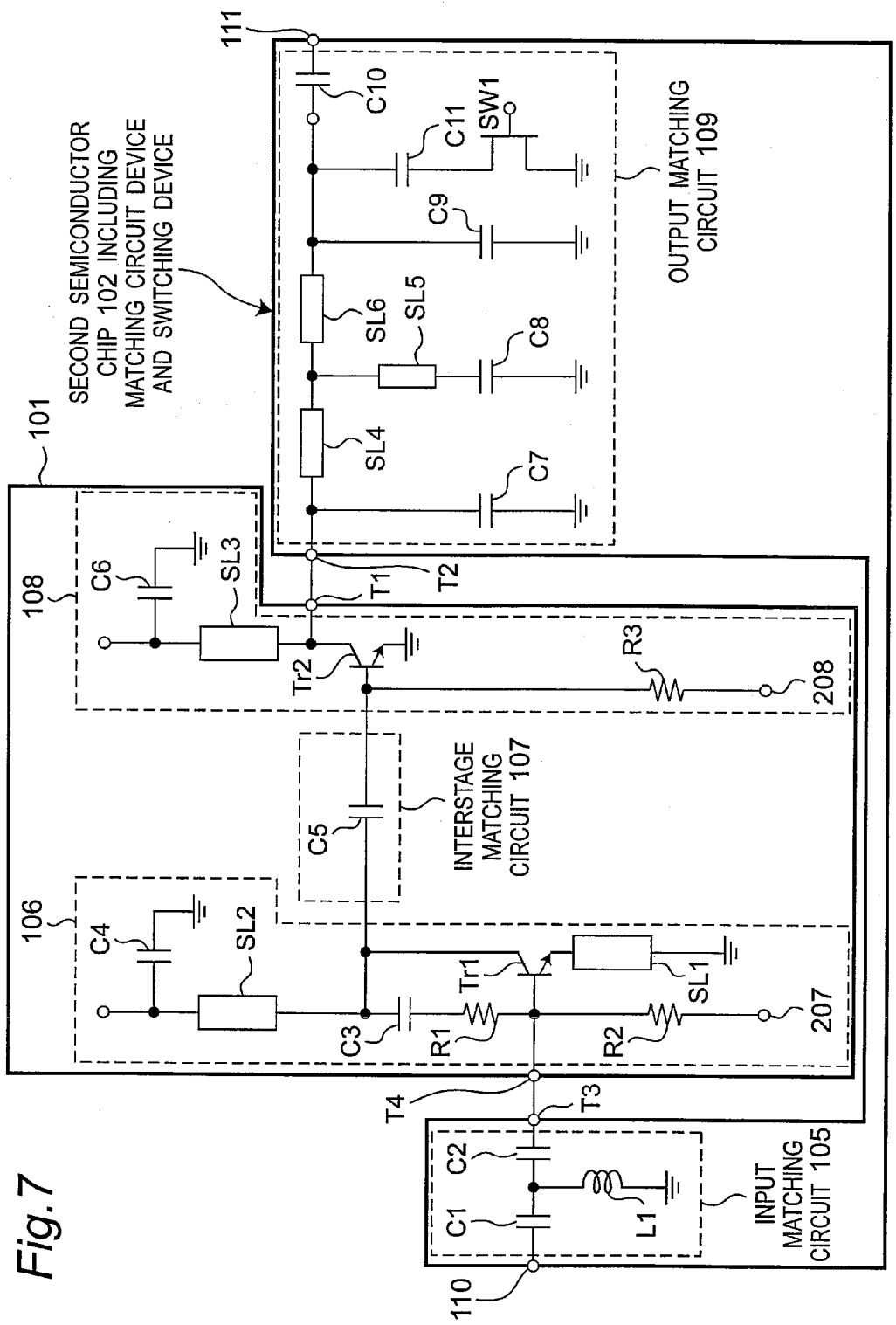

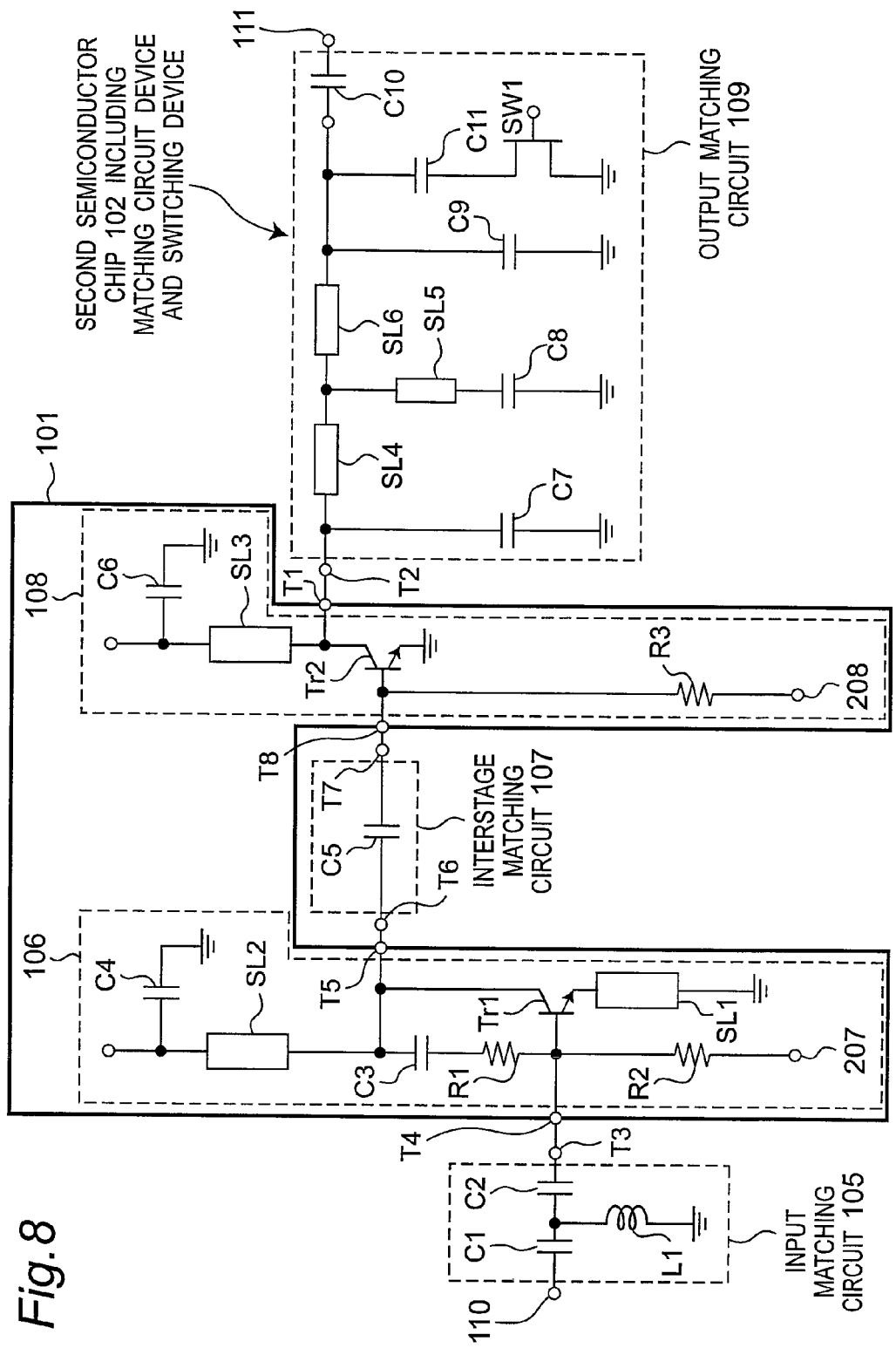

OFF/OFF

ON/OFF

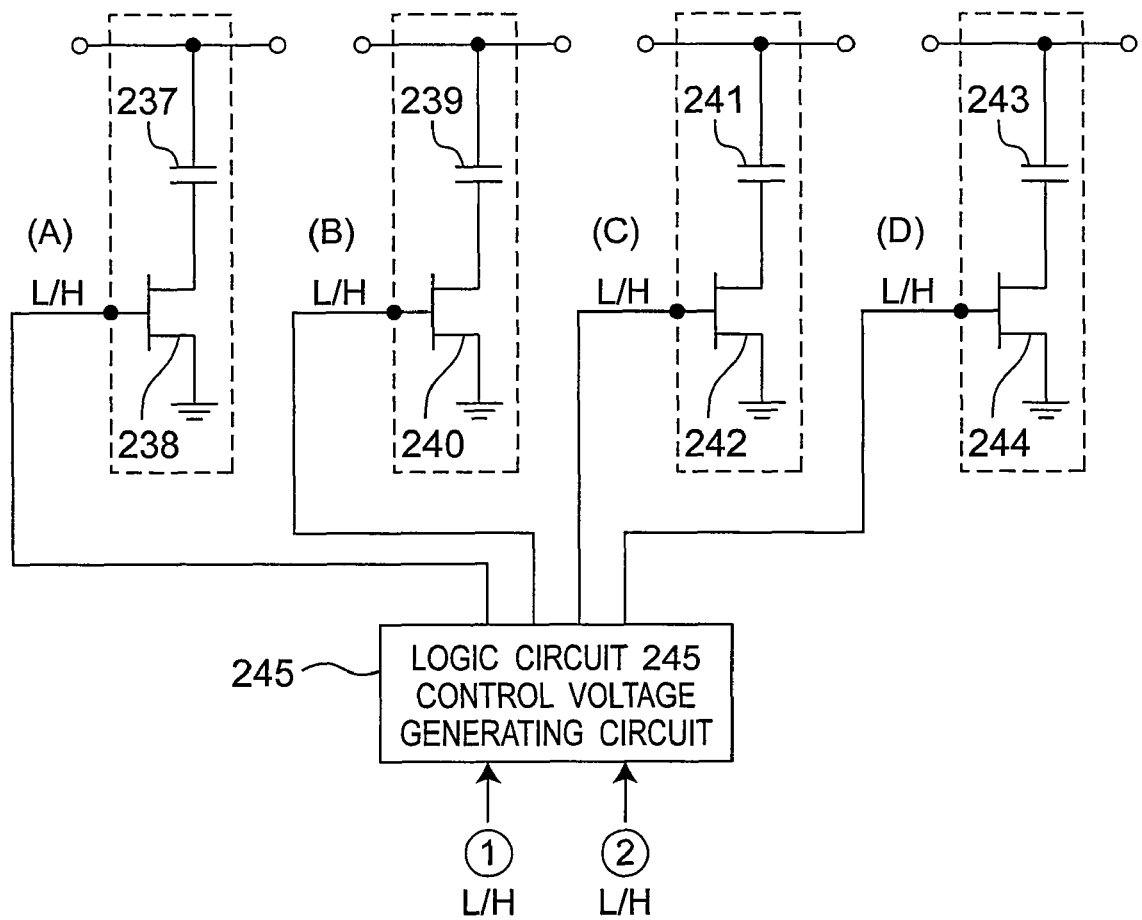

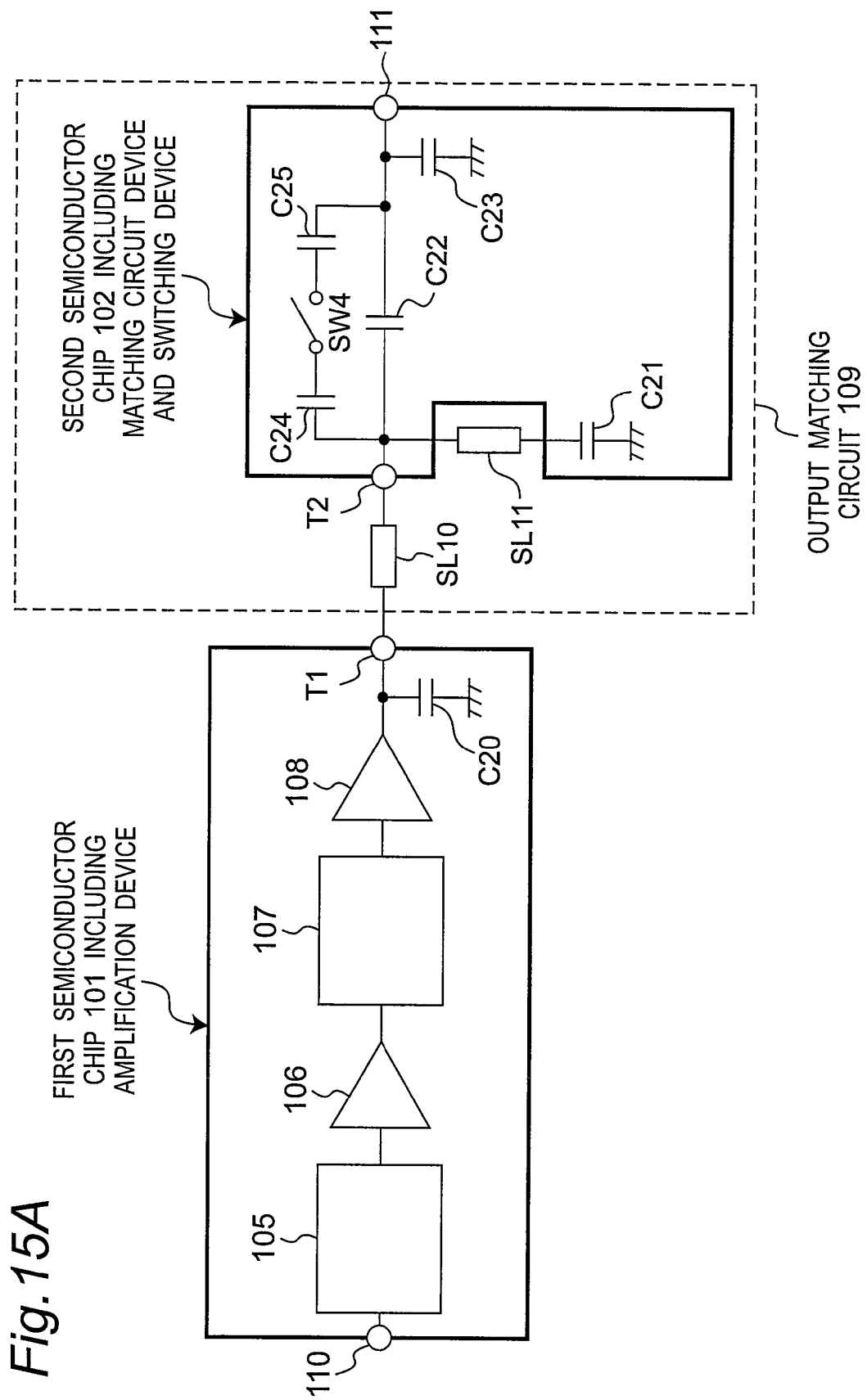

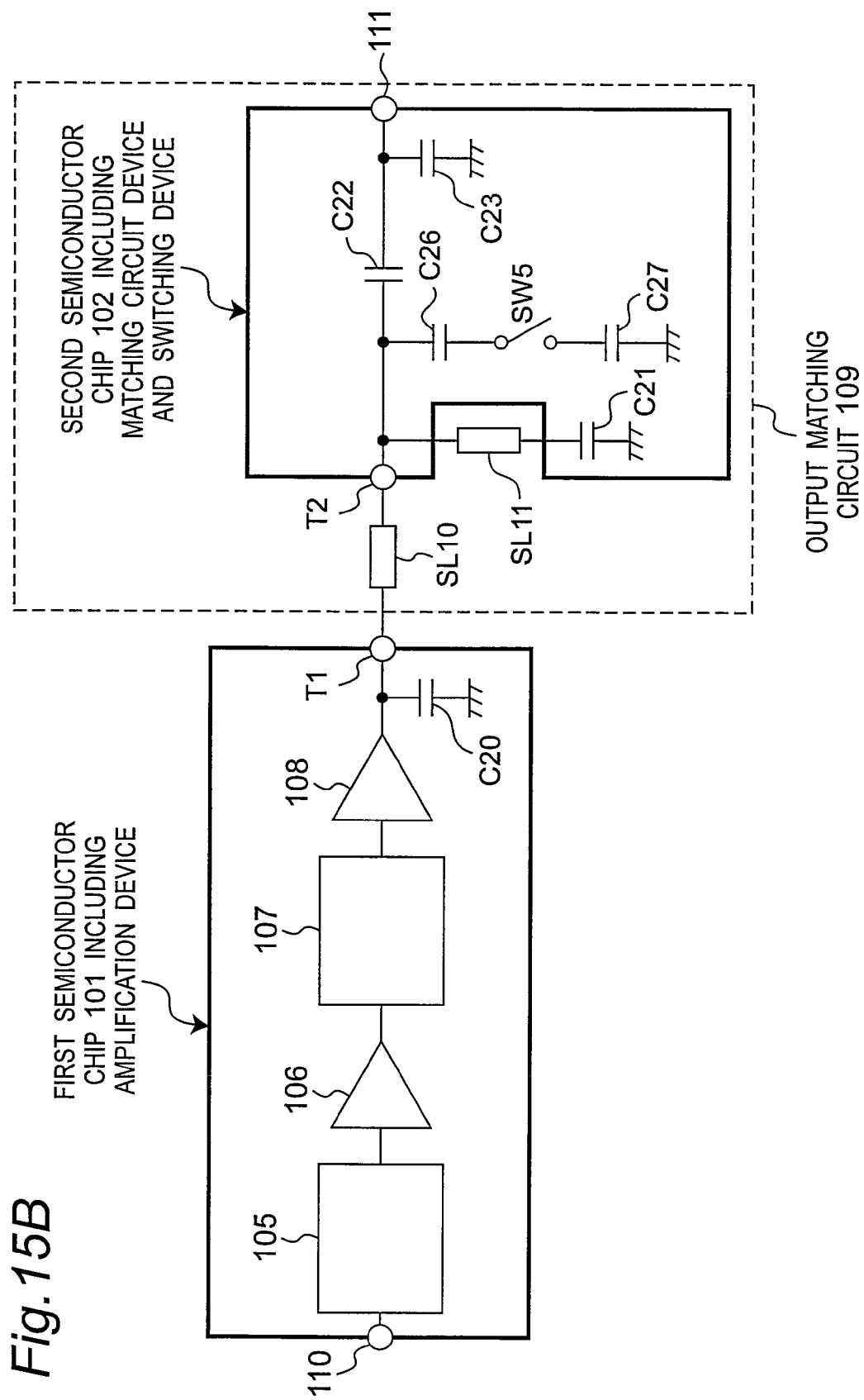

HIGH FREQUENCY POWER AMPLIFIER

BACKGROUND OF THE INVENTION

1. Field of Invention

The present invention relates to a high frequency power amplifier that is used in mobile communication devices.

2. Description of Related Art

High frequency power amplifiers that are used in cell phones, for example, have an amplification device such as a transistor, an input matching circuit for efficiently inputting a high frequency signal to the amplification device, and an output matching circuit for efficiently outputting the high frequency signal from the amplification device. The matching circuits have a capacitance and a high frequency matching device such as an inductor or microstrip line, and are typically rendered as a packaged chip mounted on a circuit board. A semiconductor chip containing the high frequency amplification device is also mounted on the circuit board, and combined these components render a high frequency power amplifier module.

Cell phones have come to offer a wide range of functions including multiband signal transmission capabilities and multimode functions for handling different modulation signals. Battery size has also decreased as cell phones have become smaller, thus requiring higher efficiency high frequency power amplifiers in order to assure sufficient communication time, and there is a need to emphasize efficiency during low power operation instead of only near the maximum output level. As known from the literature, optimizing the efficiency of the high frequency power amplifier requires matching the input and output impedance under various frequency, output, and other conditions, and plural individual high frequency power amplifiers having matching circuits with optimized impedance are required in order to provide multiband and multimode compatibility.

U.S. Pat. No. 6,281,748 (corresponding to Japanese Laid-open Patent Publication No. 2001-251202) teaches an arrangement having a control device affording such compatibility.

FIG. 19 shows an example of the prior art. The matching circuit on the output side of the last amplification device includes a variable capacitance 300 and capacitance 301, a switching diode 302 connected in series to the capacitance, and an arrangement including an inductor 303, a bypass capacitor 304, and a resistance 305 on the path connected to the control circuit, and the impedance of the output load circuit 306 can be varied by controlling these devices. If the devices 300 to 305 are rendered as chips mounted on a circuit board, the area of the power amplification module including the matching circuit is increased as shown in FIG. 20. The area is further increased and the module becomes even more complicated if sophisticated control techniques for multiband switching and output power switching are also incorporated.

The present invention provides a high frequency power amplifier that enables easily adjusting and switching the impedance while reducing the area of the power amplification module and assuring high performance and low cost.

SUMMARY OF THE INVENTION

A high frequency power amplifier according to a first aspect of the invention has a first semiconductor chip that includes a main amplification stage having a first high frequency amplification device, and a second semiconductor chip that includes a main matching stage having a first switching device. The main amplification stage includes a first output pin operable to output a first signal amplified by the first high frequency amplification device, and the main matching stage includes a first input pin operable to receive the first signal and a first high frequency matching circuit device operable to match the first signal.

This arrangement enables integrating the impedance matching circuit of a power amplifier having a switching function in a semiconductor chip with a small footprint, and enables complicated switching control. A small, multiband-compatible, high performance power amplification module can therefore be provided.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 7 is a second block diagram of a high frequency power amplifier according to the present invention.

FIG. 8 is a third block diagram of a high frequency power amplifier according to the present invention.

FIG. 13A is a circuit diagram showing an example of an impedance switching circuit that is used in a high frequency power amplifier according to the present invention.

FIG. 13B is a logic table of the logic circuit that controls the impedance switching circuit shown in FIG. 13A.

FIG. 15A is a block diagram of a first variation of a high frequency power amplifier according to the present invention.

FIG. 15B is a block diagram of a second variation of a high frequency power amplifier according to the present invention.

DETAILED DESCRIPTION OF THE PREFERRED EMBODIMENTS

FIG. 1A, FIG. 1B, FIG. 2, FIG. 3 and FIG. 4 show the arrangement of a high frequency power amplifier in which the invention is used. The high frequency power amplifier according to the invention uses a high frequency band range from 800 MHz to 3 GHz, and more broadly uses the range from 400 MHz to 5 GHz. The power output after amplification is approximately 5 watts.

Figure 1A:
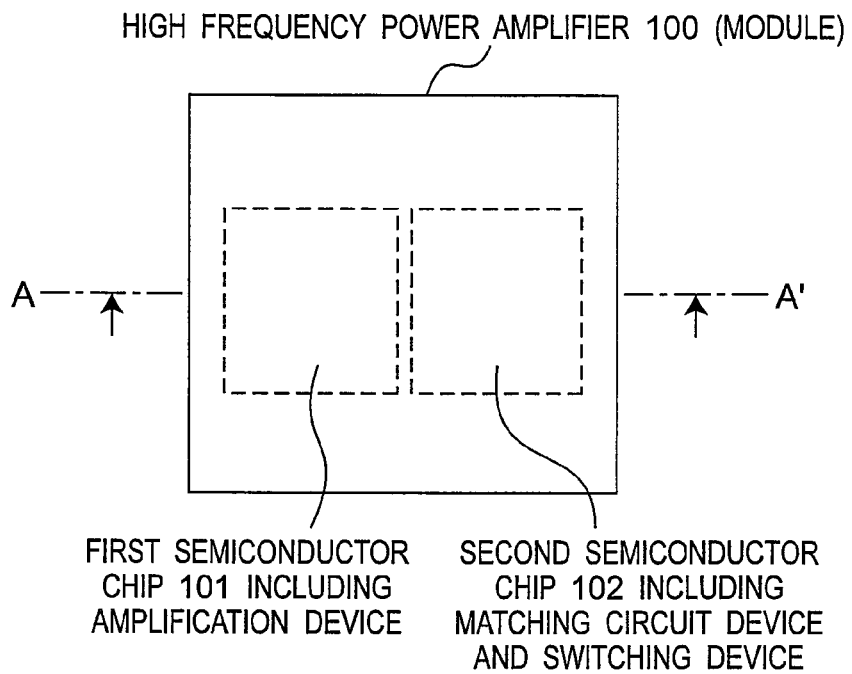
FIG. 1A shows the arrangement of a high frequency power amplifier according to the present invention.

The high frequency power amplifier 100 shown in FIG. 1A includes a semiconductor chip including an amplification device (also referred to as a "high frequency amplification device") 1017 and a semiconductor chip including a matching circuit device (also referred to as a "high frequency matching circuit device") and switching device 102. The high frequency power amplifier 100 (also referred to as simply a "high frequency amplifier") is rendered as a single module including the first and second semiconductor chips, a resin or ceramic substrate 103 on which the semiconductor chips are mounted, and a sealing resin 104 or cap. In this aspect of the invention the two semiconductor chip blocks 101 and 102 are used in the module which together with microstrip lines and other circuit devices formed on the substrate render the high frequency power amplifier 100.

Figure 1B:
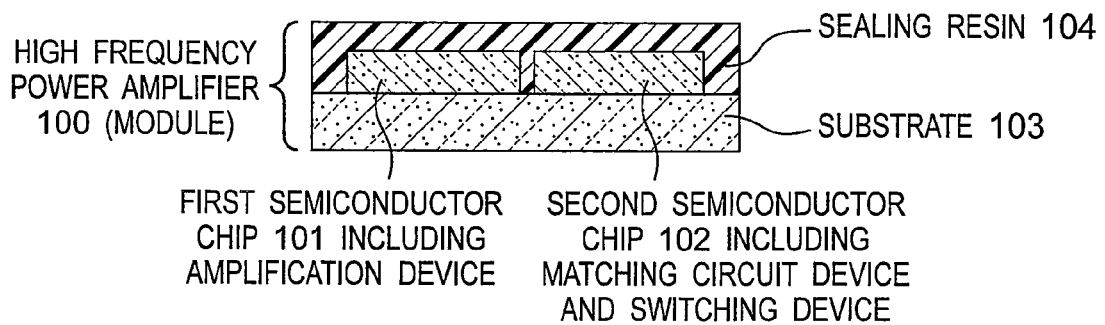
FIG. 1B is a section view of a high frequency power amplifier according to the present invention.

FIG. 1B is a section view of this aspect of the invention. The resin or ceramic substrate 103 and the sealing resin 104 are shown. The semiconductor chips 101 and 102 are mounted on the substrate 103 and connected by wire bonding or other arrangement to lands on the substrate. The microstrip lines and other high frequency circuit devices can be formed on the substrate 103.

Figure 2:
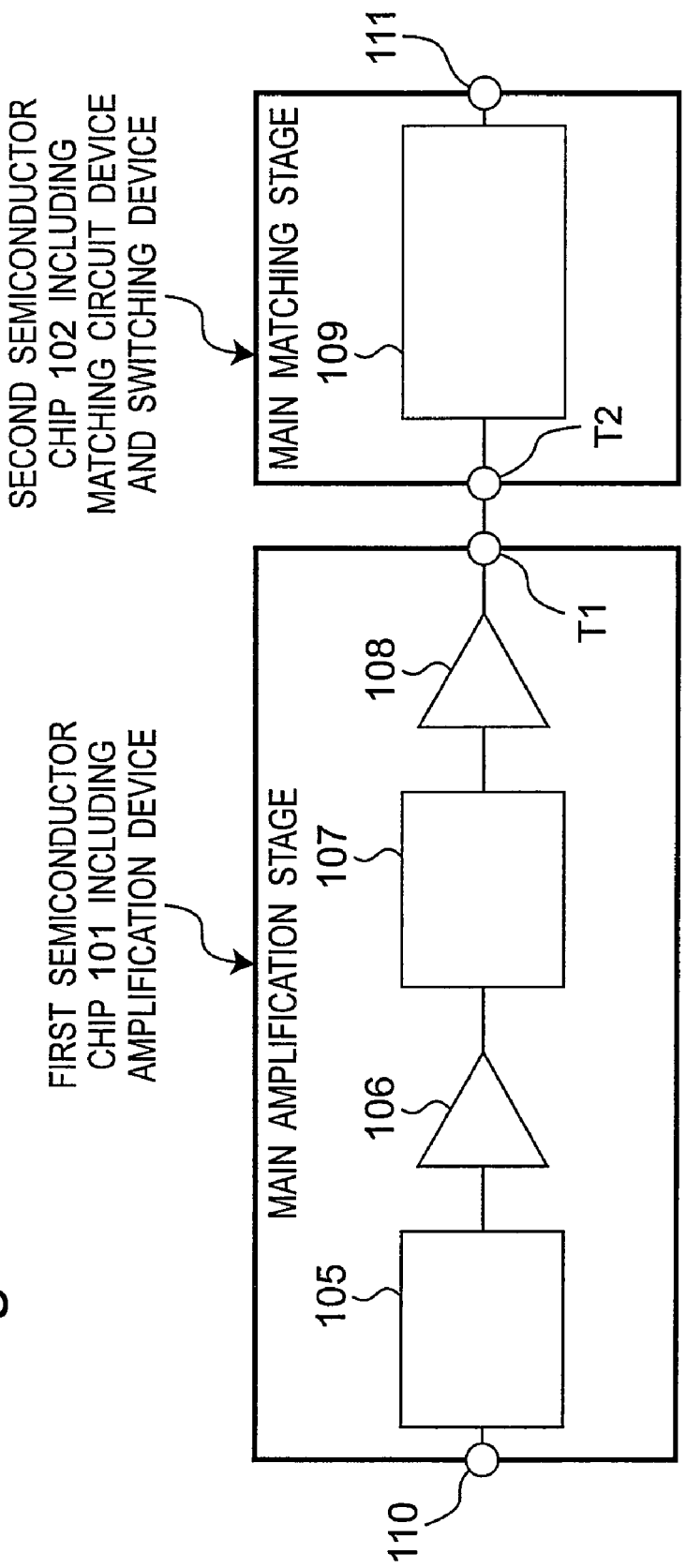
FIG. 2 is a block diagram of a first example of a high frequency power amplifier according to the present invention.

FIG. 2 is a first block diagram showing the arrangement of a high frequency power amplifier according to the present invention. Shown in FIG. 2 are an input matching circuit block 105 of a two-stage amplifier, a preamplification circuit block 106 of a two-stage amplifier, an interstage matching circuit block 107, a second amplifier circuit block 108, and an output matching circuit block 109. In the arrangement shown in FIG. 2 a switching device is included in the output matching circuit block 109, and the matching circuit device and switching device are rendered on the second semiconductor chip 102. Blocks 105, 106, 107, 108 are rendered in the first semiconductor chip including the amplification devices. Blocks 105, 106, 107, 108 are collectively referred to as the main amplification stage, and block 109 is called the main matching stage.

The main amplification stage is upstream of the main matching stage. The main amplification stage includes at least block 108, and blocks 105, 106, and 107 can be omitted. The input matching circuit block 105 and the interstage matching circuit block 107 are used for matching the relatively low power signals in the high frequency power amplifier, and are thus simpler than the output matching circuit block 109 that is used for matching the relatively high power signals output to the external impedance circuit.

The first semiconductor chip 101 has an output pin T1 for outputting the output signal amplified by the high frequency amplification device, and the second semiconductor chip 102 has an input pin T2 for receiving the output signal of the high frequency amplification device and a high frequency matching circuit for matching the output signal. The high frequency matching circuit rendered in the second semiconductor chip 102 is described in detail in FIG. 6A.

Figure 3:
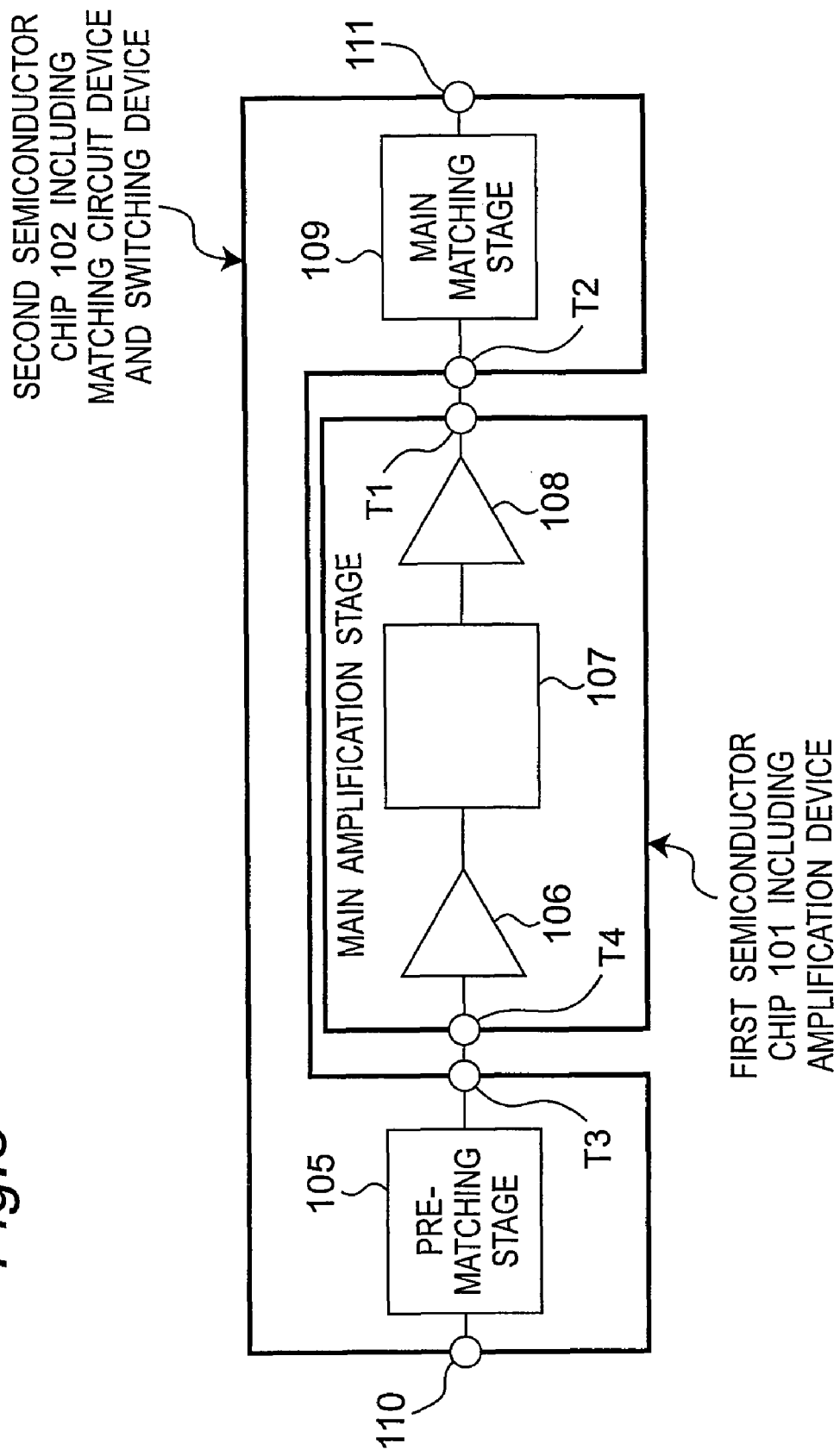
FIG. 3 is a block diagram of a second example of a high frequency power amplifier according to the present invention.

FIG. 3 is a second block diagram showing the arrangement of a high frequency power amplifier according to another aspect of the invention of the invention. In this arrangement the input matching circuit 105 and the output matching circuit 109 are rendered on the second semiconductor chip 102 having a switching device, and blocks 106, 107, and 108 are formed on the first semiconductor chip including the high frequency amplification device.

Block 105 is also called a prematching stage, blocks 106, 107, and 108 are collectively called the main amplification stage, and block 109 is called the main matching stage. The main amplification stage is upstream of the main matching stage, and the prematching stage is upstream of the main amplification stage.

The main amplification stage includes at least block 108, and blocks 106 and 107 may be omitted. The interstage matching circuit block 107 is used for matching the relatively low power signals in the high frequency power amplifier, and is thus simpler than the output matching circuit block 109 that is used for matching the relatively high power signals output to the external impedance circuit.

The first semiconductor chip 101 has an input pin T4 for receiving the source signal to be amplified by the high frequency amplification device, and the second semiconductor chip has an output pin T3 for outputting the source signal and a high frequency matching circuit for matching the source signal. The high frequency matching circuit disposed to the second semiconductor chip 102 is described in detail in FIG. 7.

Block 109 can be rendered in a discrete semiconductor chip separately from the second semiconductor chip 102. In this case block 109 can be included in the first semiconductor chip 101.

Figure 4:
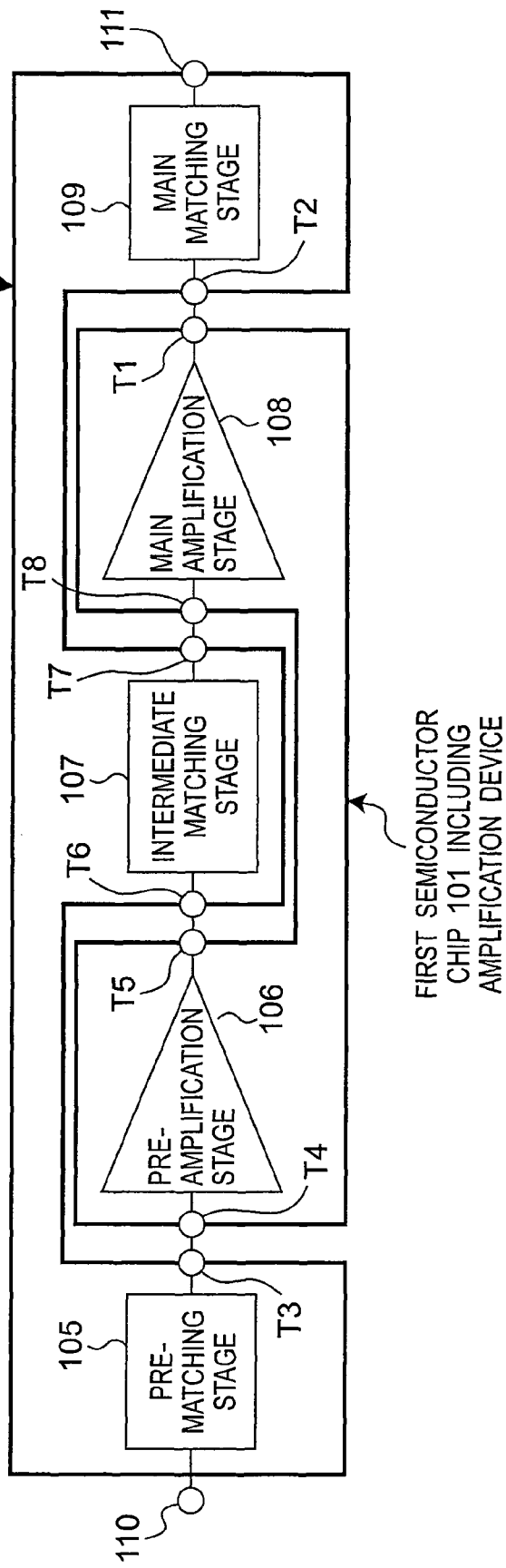
FIG. 4 is a block diagram of a third example of a high frequency power amplifier according to the present invention.

FIG. 4 is a third block diagram showing the arrangement of a high frequency power amplifier according to another aspect of the invention of the invention. In this arrangement the input matching circuit 105, the interstage matching circuit block 107, and the output matching circuit 109 are rendered on the second semiconductor chip 102 having a switching device, and blocks 106 and 108 are formed on the first semiconductor chip 101 including the amplification device.

Block 105 is also called a prematching stage, block 106 is also called a preamplification stage, block 107 is also called an intermediate matching stage, block 108 is also called the main amplification stage, and block 109 is also called the main matching stage. The main amplification stage is upstream of the main matching stage, the intermediate matching stage is upstream of the main amplification stage, the preamplification stage is upstream of the intermediate matching stage, and the prematching stage is upstream of the preamplification stage.

The first semiconductor chip 101 has a first stage high frequency amplification device (in block 106) and a second stage high frequency amplification device (inside block 108), and an output pin T5 for outputting the interstage signal amplified by the first high frequency amplification device before matching by the intermediate matching stage. The second semiconductor chip 102 has an input pin T6 for receiving the intermediate signal before matching and a high frequency matching circuit device for matching the interstage signal before matching by the main matching stage.

The first semiconductor chip 101 also has an input pin T8 for receiving the interstage signal after matching, and the second semiconductor chip 102 has an output pin T7 for outputting the interstage signal after matching. The high frequency matching circuit disposed to the second semiconductor chip 102 is described in detail in FIG. 8.

Blocks 105 and 109 can be rendered in a discrete semiconductor chip separately from the second semiconductor chip 102. In this case either or both of blocks 105 and 109 can be included in the first semiconductor chip 101.

Figure 5:
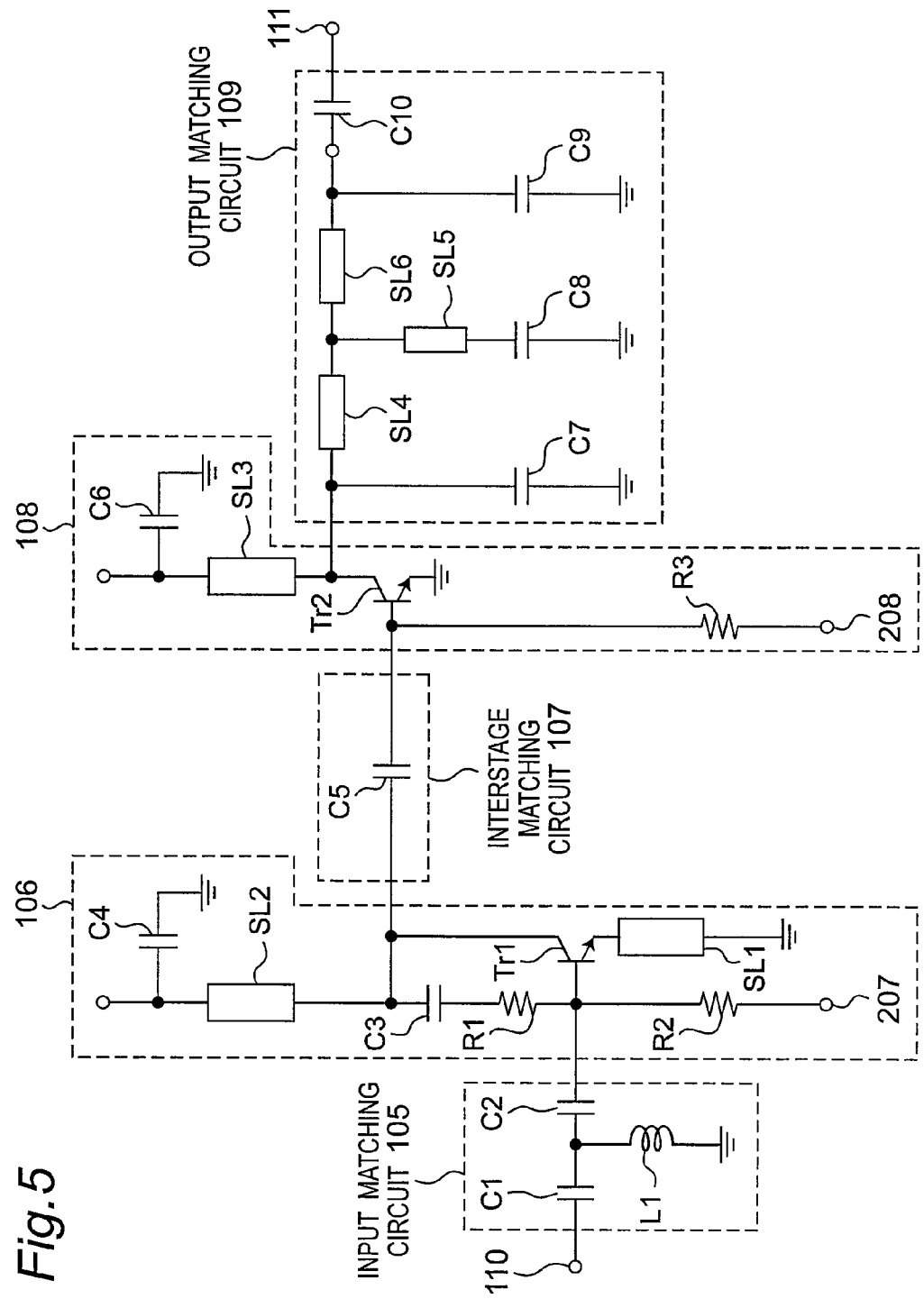
FIG. 5 is a circuit diagram showing the arrangement of a high frequency power amplifier for describing the invention.

The actual circuit diagrams are described next. FIG. 5 is a circuit diagram of a high frequency power amplifier for describing the invention, and shows a device having a two-stage amplifier.

The input matching circuit 105 has capacitors C1, C2 and an inductor L1. This arrangement is only one example, however, and other arrangements can be used.

The preamplification circuit 106 has an amplification transistor Tr1, resistances R1 and R2, capacitors C3 and C4, and microstrip lines SL1 and SL2. Pin 207 is connected to a bypass circuit (not shown in the figure) for supplying a bypass current or voltage to the amplification transistor Tr1. C4 functions as a bypass capacitor. SL2 can be an inductor.

The interstage matching circuit 107 is a capacitor C5.

The second amplifier circuit 108 includes an amplification transistor Tr2, a resistance R3, a capacitor C6, and a microstrip lines SL3. Pin 208 is connected to a bypass circuit (not shown in the figure) for supplying a bypass current or voltage to the amplification transistor Tr2. C6 functions as a bypass capacitor. SL3 can be an inductor.

The output matching circuit 109 includes capacitors C7, C8, and C9, and microstrip lines SL4, SL5, SL6.

As shown in FIG. 2, FIG. 3, and FIG. 4, the high frequency power amplifier of the invention is composed of at least two semiconductor chips, that is, a first semiconductor chip and a second semiconductor chip, and requires that the two semiconductor chips are rendered in unison.

The first semiconductor chip includes at least an amplification device, and this amplification device includes, for example, a preamplification device Tr1 and a second amplification device Tr2. The amplification devices are, for example, amplification transistors. The amplification transistors are, for example, bipolar transistors. The amplification transistors can, for example, be heterojunction bipolar transistors such as silicon-germanium transistors. The amplifier circuit includes an amplification device and an adjustment resistance or capacitance.

The second semiconductor chip includes at least a matching circuit device and a switching device. The matching circuit device includes at least a capacitor, an inductor, or a microstrip line.

The first semiconductor chip and the second semiconductor chip are rendered in unison. "Rendered in unison" as used herein means they are formed as a single unit, such as when the first semiconductor chip and the second semiconductor chip are disposed on the same substrate or are packaged together.

The first semiconductor chip 101 including the amplification device includes at least the second amplifier circuit block 108, and the second semiconductor chip 102 including the matching circuit device and the switching device includes at least the output matching circuit 109.

Comparing the first semiconductor chip 101 and the second semiconductor chip 102, the first semiconductor chip 101 amplifies signals by a bipolar transistor or other amplification device, and the second semiconductor chip 102 matches the signal by the matching circuit device and switching device. The manufacturing processes therefore differ and the first semiconductor chip 101 is more complex than the second semiconductor chip 102. The devices included in the first semiconductor chip 101 require performance and precision sufficient for signal amplification. The chip cost per unit area is therefore higher for the first semiconductor chip 101 than the second semiconductor chip 102.

In the case of the second semiconductor chip 102 the matching circuit device is composed of passive devices that can be manufactured by a relatively simple manufacturing process, and the switching device only switches signals and therefore does not require the performance and precision required for signal amplification. The chip cost of the second semiconductor chip 102 is therefore less than the first semiconductor chip 101. Furthermore, the switching device is a field effect transistor or heterojunction field effect transistor (HEMT), and the manufacturing process of the second semiconductor chip 102 is therefore quite different from the process used for the first semiconductor chip 101 that consists of mainly bipolar transistors.

The first semiconductor chip 101 and the second semiconductor chip 102 thus differ in their manufacturing processes, require different levels of performance and precision, and as a result differ in cost. If the devices of the high frequency power amplifier 100 are integrated in a semiconductor chip different in construction than the first semiconductor chip 101 and second semiconductor chip 102, not only does the manufacturing process become more complex but it becomes more difficult to assure the desired performance and yield drops. The total cost therefore rises and the size of the high frequency power amplifier 100 module also increases. However, by splitting the high frequency power amplifier 100 into primarily a first semiconductor chip 101 and a second semiconductor chip 102, an amplifier that is advantageous in terms of cost, manufacturability, performance, and size can be achieved.

First Embodiment

Figure 6A:
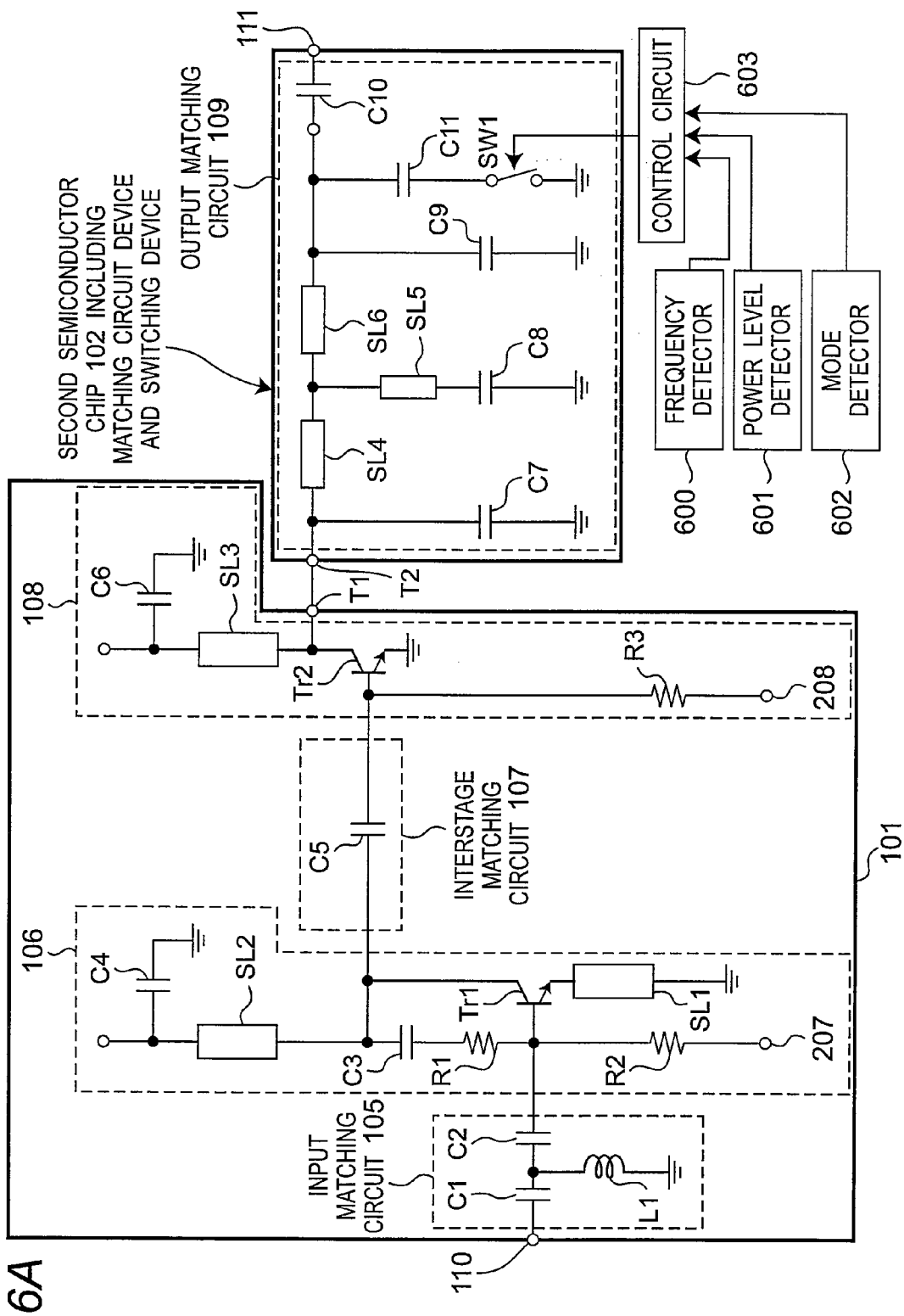
FIG. 6A is a first block diagram of a high frequency power amplifier according to the present invention.

FIG. 6A is a circuit diagram corresponding to the arrangement shown in FIG. 2, and shows a first embodiment of a high frequency power amplifier employing the present invention.

This arrangement differs from the circuit shown in FIG. 5 in that a capacitor C11 and a switching device SW1 are added to the output matching circuit 109. Because the switching device SW1 is open when off and the capacitor C11 is not connected to the matching circuit as a ground capacitance, the output matching circuit state is equivalent to FIG. 5. When the switching device SW1 is on, the capacitor C11 is connected to the matching circuit as a ground capacitance, and the impedance of the matching circuit differs by the capacitance of C11 from the circuit shown in FIG. 5. The matching state of the output pin of the second amplification device therefore changes, efficiency can be optimized at two different output power levels or efficiency can be optimized at two different frequencies.

The output side of transistor Tr2 is connected directly to the output pin T1 of the first semiconductor chip 101 in this arrangement.

When the high frequency power amplifier according to this embodiment of the invention is used in a cell phone, a control circuit 603, a frequency detector 600, a power level detector 601, and a mode detector 602 are provided as a circuit for controlling the on/off state of the switching device SW1. If the cell phone is multiband compatible, the frequency detector 600 detects the communication frequency and when the frequency changes. The power level detector 601 detects the power level of the signal received by the cell phone. The mode detector 602 detects whether the operating mode is a voice communication mode or data communication mode. Control is possible if any one of the frequency detector 600, the power level detector 601, and the mode detector 602 is provided.

A control method based on the frequency is described next.

When the frequency detector 600 detects a frequency change, the switching device SW1 is turned on or off to change the impedance to the optimal matching state for the detected frequency, and thereby improve efficiency, for example.

A control method based on the power level is described next.

If the power level detected by the power level detector 601 is greater than or equal to a predetermined level, the control circuit 603 turns the switching device SW1 on to reduce the load impedance of the output matching circuit 109. When the detected power level goes below this predetermined level the switching device SW1 turns off to increase the load impedance. Efficiency can therefore be improved.

A control method based on the communication mode is described next.

If the mode detector 602 detects the data communication mode, the maximum output rises. In this case the control circuit 603 turns the switching device SW1 on to lower the load impedance and control matching to afford high output. However, if the mode detector 602 detects the voice communication mode, the control circuit 603 turns the switching device SW1 off for matching to increase the load impedance and increase efficiency.

Use of the high frequency power amplifier according to the present invention is described using a cell phone by way of example, but the high frequency power amplifier affords the same type of control when used in other devices.

Figure 6B:
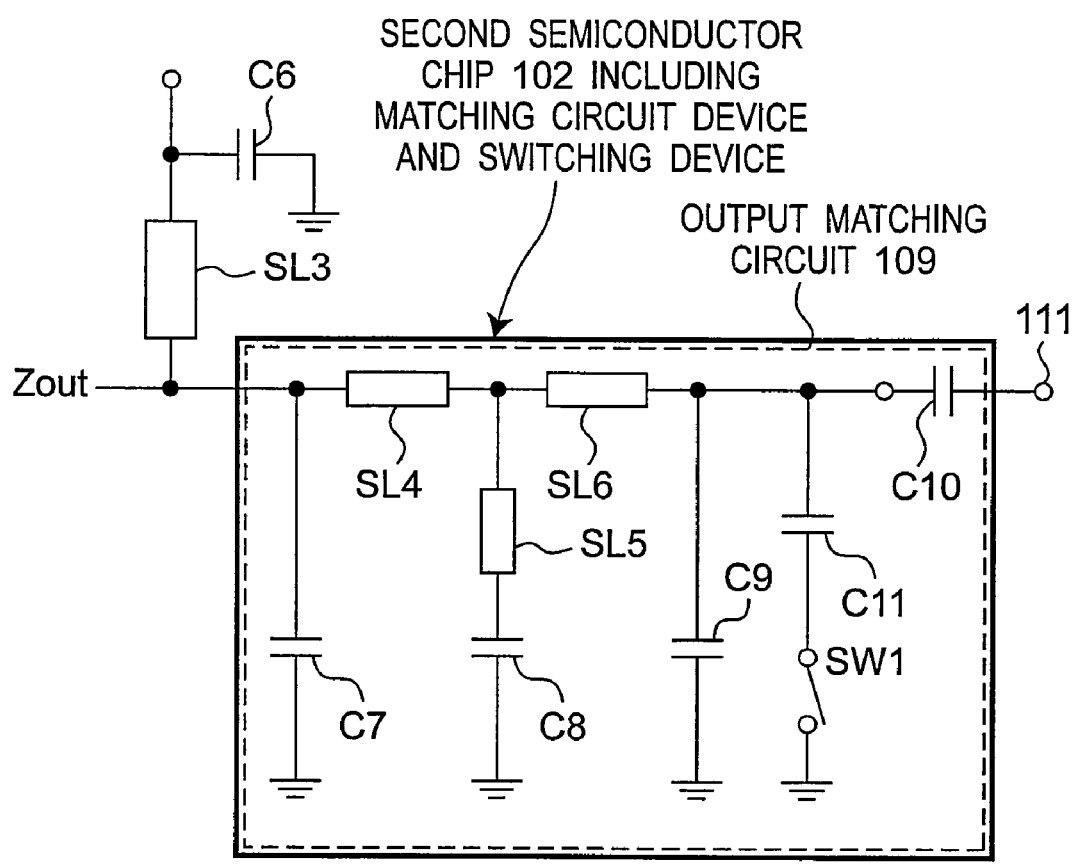
FIG. 6B is a block diagram showing a part of a high frequency power amplifier according to the present invention.
Figure 6C:
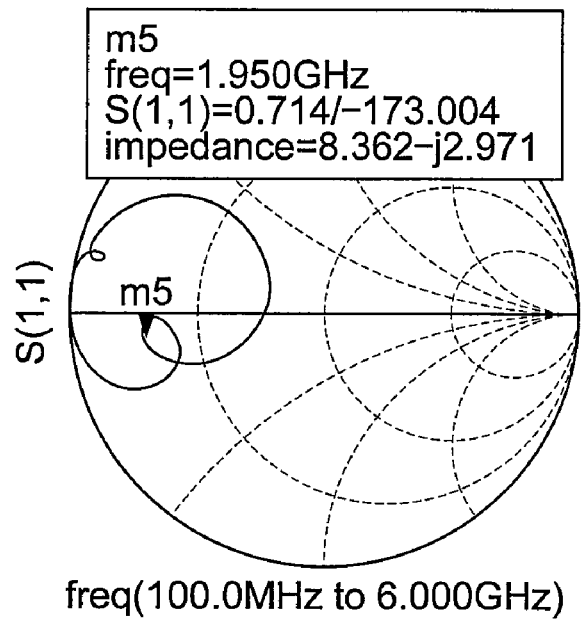
FIG. 6C is a graph showing a simulation of a high frequency power amplifier according to the present invention.
Figure 6D:
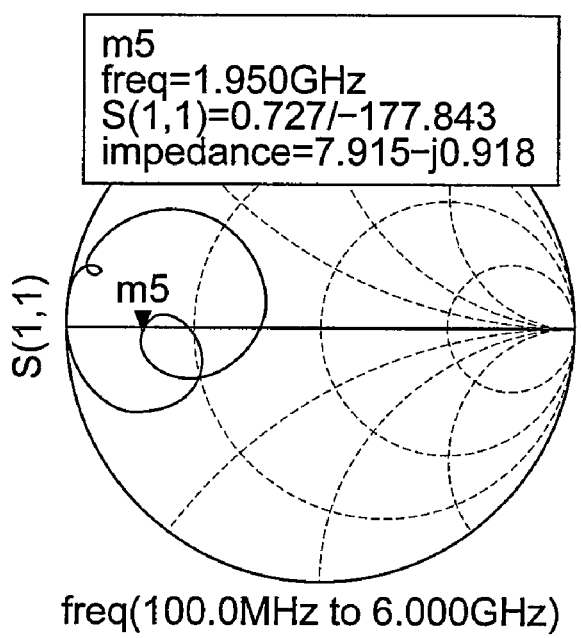
FIG. 6D is a graph showing a simulation of a high frequency power amplifier according to the present invention.

FIG. 6B shows a circuit of impedance Zout at the output pin of the second amplifier circuit 108 in FIG. 6A, and FIG. 6C and FIG. 6D show the simulated impedance Zout when the switching device SW1 is off and on, respectively (where the capacitance of the capacitor C11 is 0.5 pF). As shown in the figures, when the switching device SW1 switches from off to on, the impedance at a frequency of 1950 MHz changes with the real number portion decreasing and the absolute value of the imaginary number portion decreasing. When the real number portion is small and impedance is low, the maximum output of the high frequency power amplifier increases, and the efficiency characteristic can be optimized to the output power by controlling the state of the switching device SW1. Furthermore, because the switching device SW1 and capacitor C11 that are used for switching in this embodiment of the invention are rendered on the same semiconductor chip 102, the switching function can be integrated in a small area.

Figure 6E:
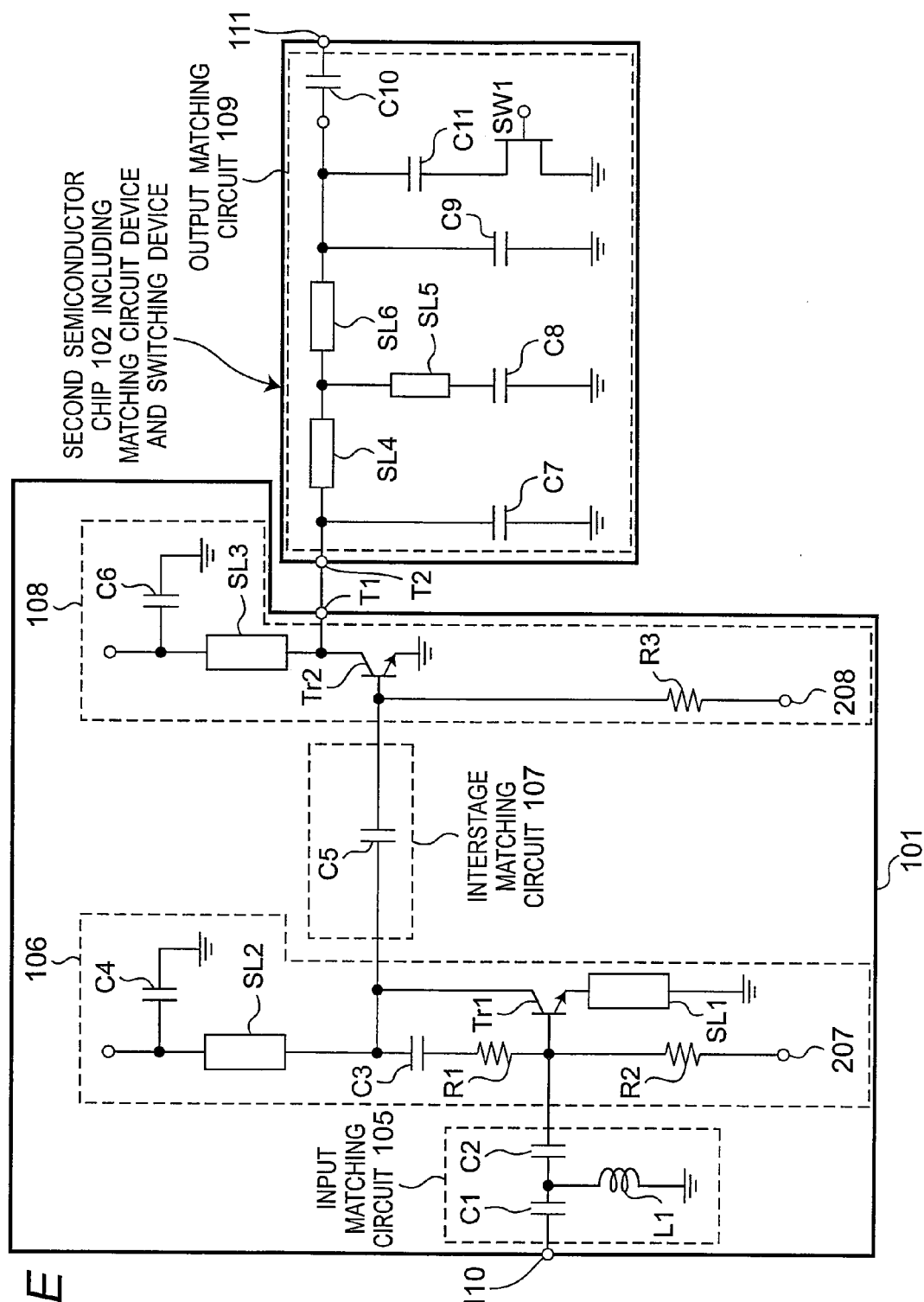
FIG. 6E is a first block diagram of a high frequency power amplifier according to the present invention.

When the switching device SW1 is a field effect transistor as shown in FIG. 6E, the on/off state can be easily controlled by the gate voltage and loss is reduced in the on state, and a switching circuit that is smaller and has less loss can be easily achieved. This arrangement is even more effective when the switching device is a heterojunction field effect transistor (HEMT). When a switching function is rendered in the output matching circuit 109 as in this embodiment of the invention, the voltage amplitude of the high frequency amplification signal at the switching device pin must be considered. More specifically, if the voltage amplitude is too high when the amplified signal level is high, specifically if the voltage amplitude exceeds the threshold voltage of the switching device SW1, the off circuit may turn on and the circuit will not switch normally. However, if an HEMT device is used and a multistage switching circuit with plural switching devices connected in series is used, a design that easily accommodates high amplification levels can be achieved. A multistage design can also reduce loss and is therefore particularly effective.

The switching devices in the following embodiments are field effect transistors or heterojunction field effect transistors.

FIG. 7 is a circuit diagram corresponding to the arrangement shown in FIG. 3, and shows a second embodiment of a high frequency power amplifier employing the present invention.

In this arrangement the input matching circuit 105 and the output matching circuit 109 are rendered on the same semiconductor chip 102.

In this arrangement the input side of transistor Tr1 is connected directly to the input pin T4 of the first semiconductor chip 101.

FIG. 8 is a circuit diagram corresponding to the arrangement shown in FIG. 4, and shows a third embodiment of a high frequency power amplifier employing the present invention.

In this arrangement the input matching circuit 105, the interstage matching circuit 107, and the output matching circuit 109 are rendered on the same semiconductor chip 102. In the embodiment shown in FIG. 8 the microstrip lines SL4, SL5, SL6 that are part of the output matching circuit are disposed externally instead of on the semiconductor chip 102.

In this embodiment the microstrip lines SL4, SL5, SL6 are rendered on the module substrate 103 and are connected to the matching circuit device on the second semiconductor chip 102 by wire bonding or other arrangement. This arrangement reduces the size of the second semiconductor chip 102.

In this arrangement the output side of the transistor Tr1 is connected directly to the output pin T5 of the first semiconductor chip 101, and the input side of transistor Tr2 is connected directly to the input pin T8 of the first semiconductor chip 101.

Figure 9:
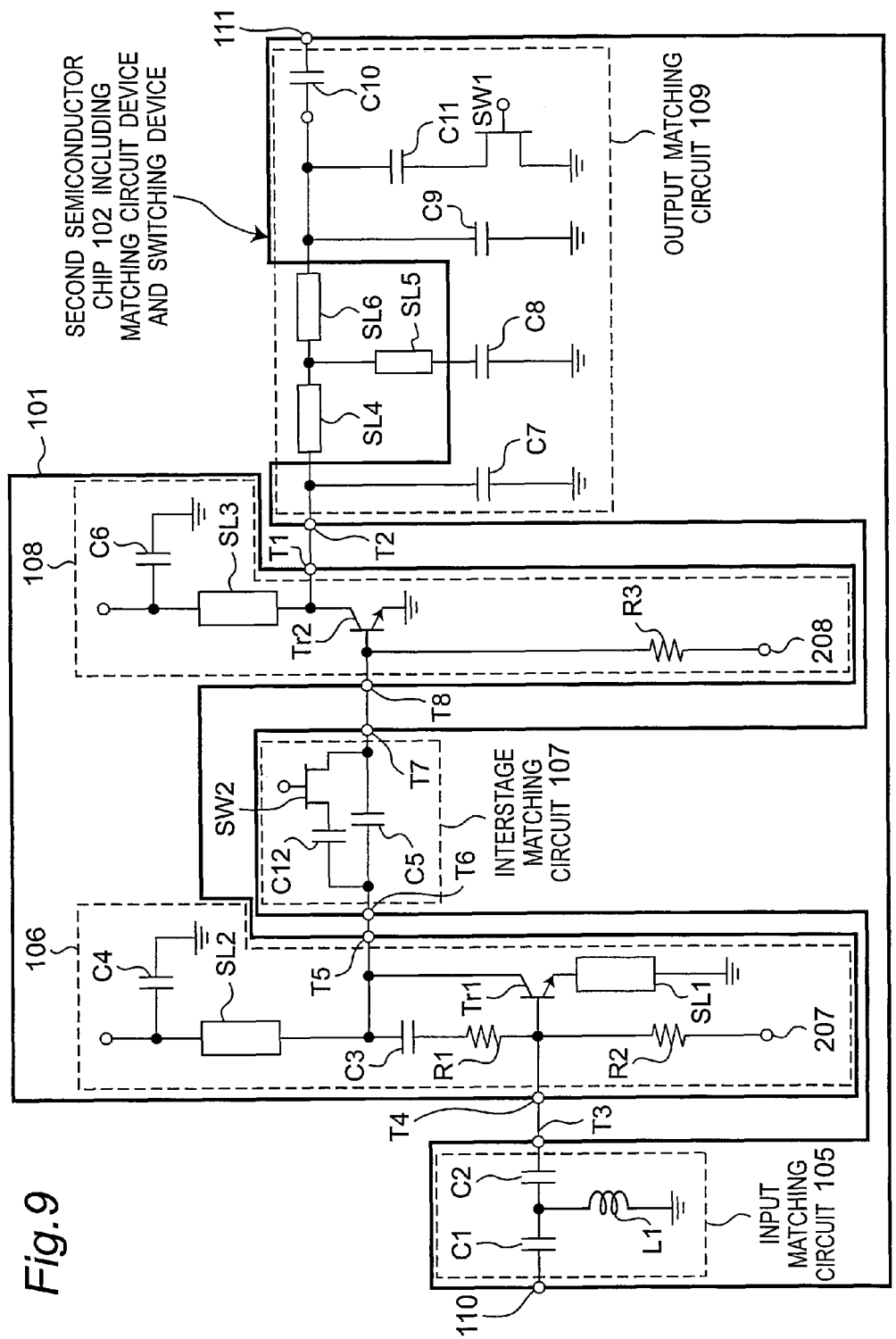
FIG. 9 is a fourth block diagram of a high frequency power amplifier according to the present invention.

In the foregoing embodiments the impedance switching circuit having the switching device is rendered only in the output matching circuit 109, but can obviously be disposed to the interstage matching circuit 107 or the input matching circuit 105. For example, as shown in FIG. 9, the impedance of the interstage matching circuit 107 can be switched by forming a switching device SW2 and capacitor C12 parallel to the serial capacitor C5 of the interstage matching circuit 107. This enables changing the input power level from the preamplification circuit 106 to the second amplifier circuit 108 according to the output level of the high frequency power amplifier, and enables switching the frequency characteristic of the interstage matching circuit 107 according to the operating frequency of the high frequency power amplifier.

The bypass circuit (connected to pins 207, 208) of the amplifier circuits 106, 108 can be rendered on the same first semiconductor chip 101 as the amplifier circuits or on the same second semiconductor chip 102 as the switching device SW1 is rendered. For example, if the amplification devices Tr1, Tr2 are bipolar transistors, it is particularly effective to render the bypass circuit using the circuit of the field effect transistor that is used as the switching device SW1 because temperature compensation and shutdown functions can be added easily with high precision. The resistance R1 and capacitor C3 disposed in the preamplification circuit 106 render a feedback circuit and function as a part of the matching circuit. The circuitry peripheral to the amplification devices Tr1 and Tr2 can be rendered on the same first semiconductor chip 101 as the amplification devices Tr1 and Tr2, on the same second semiconductor chip 102, or attached externally to the chip. Furthermore, parts of the matching circuits 105, 107, and 109 do not have to be disposed to the second semiconductor chip 102, and part can be rendered on the first semiconductor chip 101.

Furthermore, either one of the first semiconductor chip 101 including the amplification circuit devices and the second semiconductor chip 102 including the matching circuit device and switching device can be rendered on a plurality of chips. For example, the first semiconductor chip or the second semiconductor chip can be rendered on two or more chips depending on the scale of the amplification circuit or the switching complexity. Thus optimizing (downsizing) the module layout is even more effective.

In the embodiments shown in FIG. 1 and FIG. 2 the high frequency power amplifier 100 module is rendered with only the semiconductor chips 101 and 102 mounted on the substrate 103. All or part of the resistances R1, R2, capacitors C3, C4, C6, microstrip lines SL1, SL2, SL3, and inductor devices can also be rendered on the semiconductor chip in this case or connected externally. The connection between the substrate and circuit devices on the semiconductor chip is also not limited to wire bonding, and flip chip bonding, for example, can be used.

Second Embodiment

An embodiment of a switching circuit that uses the switching device and matching circuit device formed on the second semiconductor chip is described next.

Figure 10A:
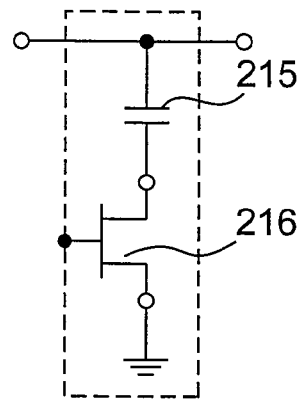
FIG. 10A is a circuit diagram showing an example of an impedance switching circuit that is used in a high frequency power amplifier according to the present invention.
Figure 10B:
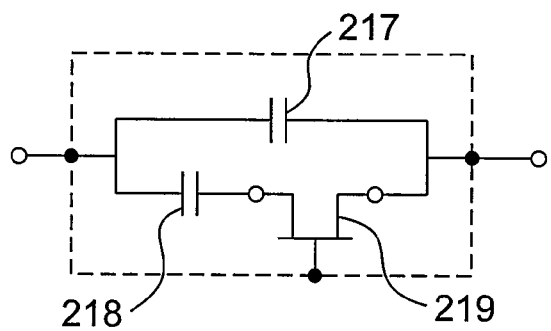
FIG. 10B is a circuit diagram showing an example of an impedance switching circuit that is used in a high frequency power amplifier according to the present invention.
Figure 10C:
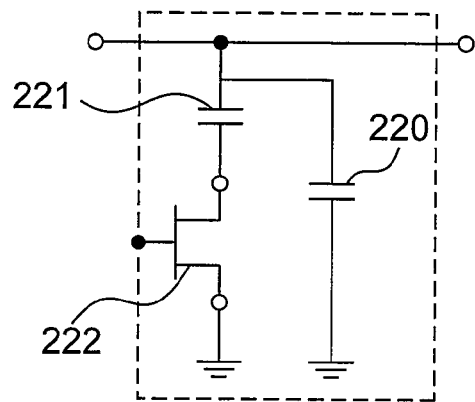
FIG. 10C is a circuit diagram showing an example of an impedance switching circuit that is used in a high frequency power amplifier according to the present invention.

FIG. 10A, FIG. 10B, and FIG. 10C are circuit block diagrams describing a second embodiment of an impedance switching circuit according to the present invention. Reference numerals 215, 217, 218, 220, and 221 are capacitance devices, and reference numerals 216, 219, and 222 are switching devices. Referring to FIG. 10A, for example, when switching device 216 is on, the capacitance device 215 is connected to the circuit as a capacitance to ground, and when the switching device 216 is off, the to-ground side of the capacitance device 215 is open and the capacitance device 215 is not connected to the circuit. Because of the parasitic capacitance of an HEMT or other switching device, the capacitance to ground is the combined serial capacitance of the capacitance device 215 and the parasitic capacitance, but because this combined capacitance is sufficiently small compared to the capacitance device 215, the matching circuit impedance can be changed by the difference in capacitance when the switching device 216 is on and off when the circuit shown in FIG. 10A is used for high frequency matching.

With the arrangement shown in FIG. 10B, the series capacitance can be switched between the capacitance device 217 and the combined capacitance of capacitance devices 217 and 218 by switching the capacitance device 219 on and off.

The capacitance to ground can also be changed as shown in FIG. 10c.

Figure 11A:
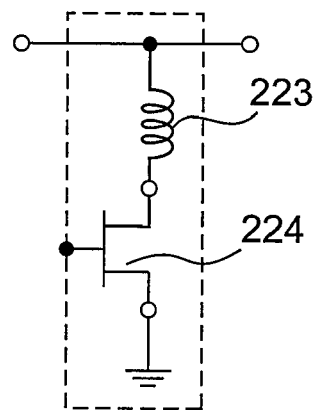
FIG. 11A is a circuit diagram showing an example of an impedance switching circuit that is used in a high frequency power amplifier according to the present invention.
Figure 11B:
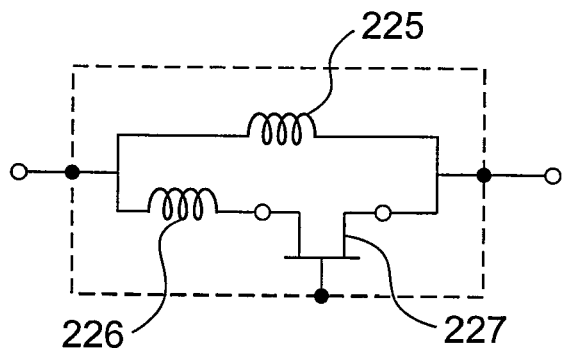
FIG. 11B is a circuit diagram showing an example of an impedance switching circuit that is used in a high frequency power amplifier according to the present invention.
Figure 11C:
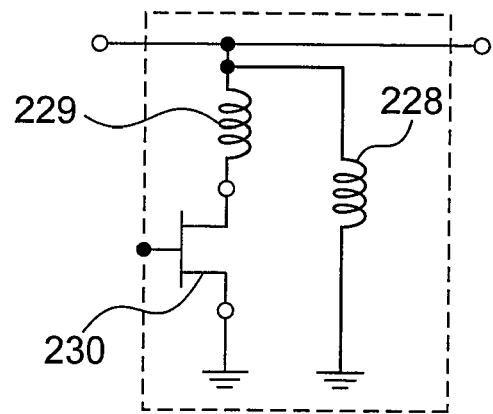
FIG. 11C is a circuit diagram showing an example of an impedance switching circuit that is used in a high frequency power amplifier according to the present invention.

The matching circuit device can also be rendered with an inductor as shown in FIG. 11A, FIG. 11B, and FIG. 11C. Furthermore, because the switching device has a parasitic capacitance as described above, switching using this capacitance as a device of the matching circuit is also possible. For example, when a HEMT is used, the parasitic capacitance per 1 mm gate width is approximately 0.2 pF, and the capacitance can be varied from several tenths of a pF to several pF by designing the gate width appropriately.

Figure 12A:
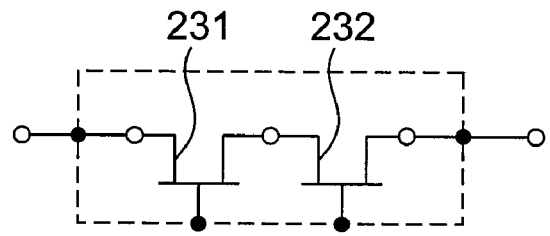
FIG. 12A is a circuit diagram showing an example of an impedance switching circuit that is used in a high frequency power amplifier according to the present invention.
Figure 12B:
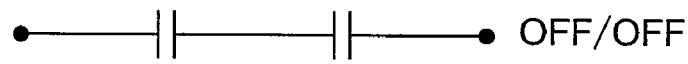
FIG. 12B is a circuit diagram showing an example of an impedance switching circuit that is used in a high frequency power amplifier according to the present invention.
Figure 12C:
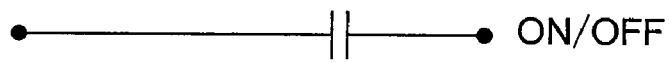
FIG. 12C is a circuit diagram showing an example of an impedance switching circuit that is used in a high frequency power amplifier according to the present invention.
Figure 12D:
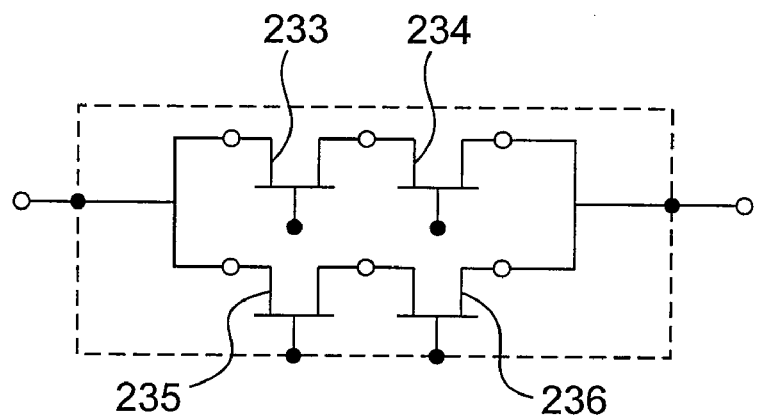
FIG. 12D is a circuit diagram showing an example of an impedance switching circuit that is used in a high frequency power amplifier according to the present invention.

Using the parasitic capacitance to tune the capacitance is described next with reference to FIG. 12A, FIG. 12B, FIG. 12C, and FIG. 12D. For example, if the off capacitance of switching devices 231, 232 connected in series as shown in FIG. 12A is 0.4 pF, the capacitance when both switching devices are off (FIG. 12B) is 0.2 pF, and the capacitance when either is on (FIG. 12C) is 0.4 pF. More switching devices can also be connected in series as shown in FIG. 12D. The impedance can be fine tuned by using the circuits shown in FIG. 12A or FIG. 12D as matching circuit devices in series or to ground.

This embodiment of the invention is described with a single switching device. An HEMT or other switching device is used in the actual circuit, but a plurality of switching devices can be connected in series in order to assure the desired switching operation according to the voltage applied to the switching device as described in the first embodiment. A multistage switching circuit is easy to render, can be used in a high output power matching circuit, and is thus particularly effective. The supply voltage can be increased instead of using a multistage arrangement in this case, but boosting the battery voltage is required when used in a cell phone. If the required voltage booster is rendered on the second semiconductor chip, however, high output can be achieved with only a few stages.

Third Embodiment

Another embodiment of a switching circuit is described below using FIG. 13A and FIG. 13B. The capacitances 237, 239, 241, 243 that are the matching devices are part of the matching circuit of the corresponding amplifier device, and the matching circuit is connected or disconnected by switching the control voltage (A) to (D) of the switching devices 238, 240, 242, 244 low (L) or high (H). Because there are four switches, a logic circuit 245 is provided and two control pins are used to switch the four control voltages (A) to (D) low or high. The four switching states are shown in FIG. 13B. This logic circuit is rendered on the second semiconductor chip in this embodiment of the invention, thus enabling controlling switching the impedance between more levels easily with a simple interface while reducing the chip size and the size of the amplifier device. Furthermore, because the logic circuit can be easily rendered using HEMT devices, for example, this function can be rendered on the second semiconductor chip. If the amplifier has more functions and channels, plural chips having a switching device and matching circuit device can be used, and a logic circuit can be rendered in one or more of the chips.

Fourth Embodiment

Figure 14:
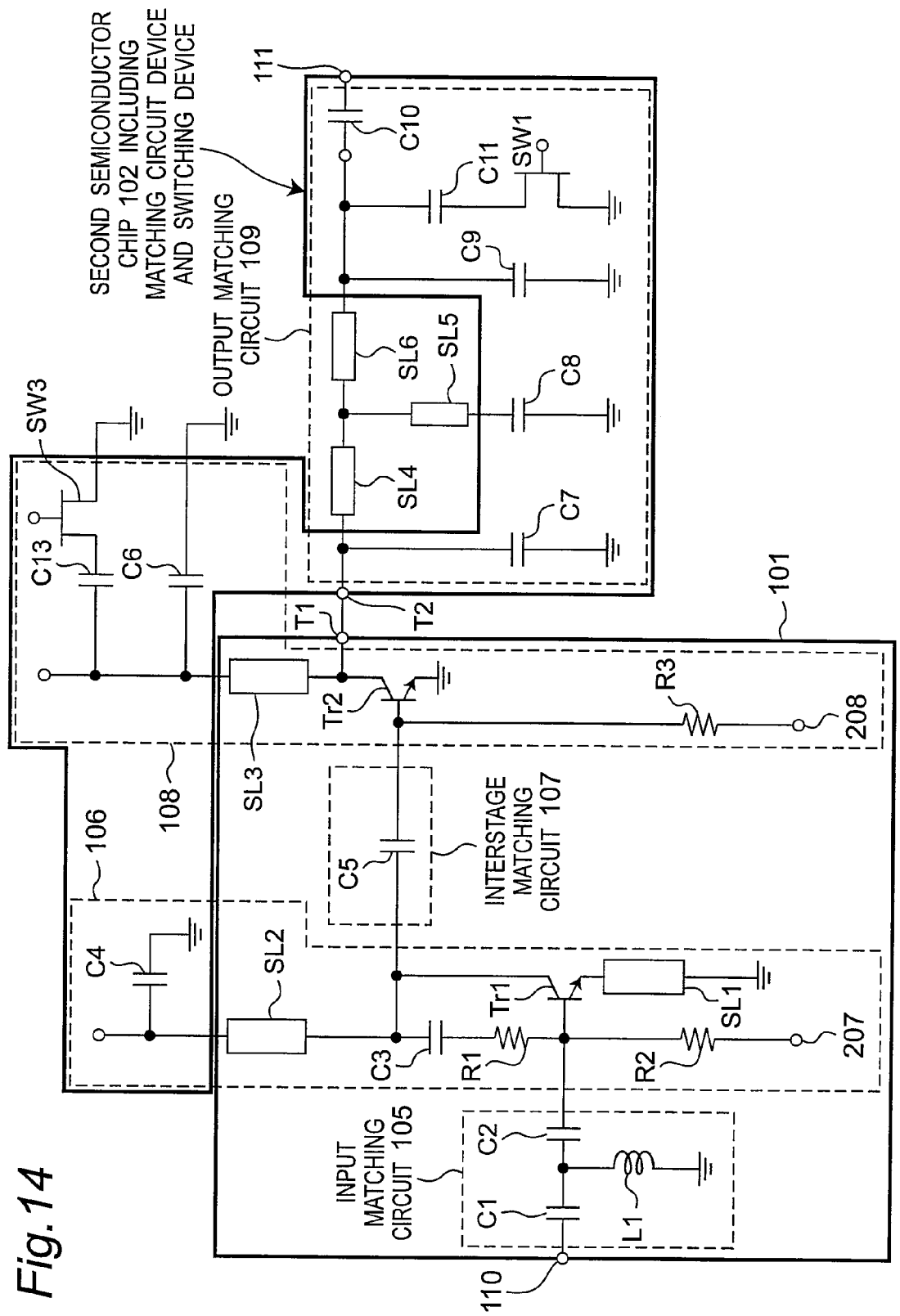
FIG. 14 is a fifth block diagram of a high frequency power amplifier according to the present invention.

FIG. 14 is a circuit diagram of a fifth embodiment of a high frequency power amplifier according to the present invention. This embodiment is a variation of the high frequency power amplifier shown in FIG. 6E. The second semiconductor chip 102 includes a matching circuit device and switching device. This embodiment of the invention includes a bypass capacitance C4 to the power source of the preamplification device, and a bypass capacitance C6 to the power source of the second amplification device. A capacitance C13 and switching device SW3 parallel connected to capacitor C6 are also included.

The bypass capacitors C4, C6, C13 are designed with a capacitance of several ten to several thousand picofarads in order to remove the effect of the supply-side impedance on high frequency amplification and to suppress the pass-through characteristic on the low frequency side of the amplified frequency band. Because the area of the capacitance device increases when such a high capacitance device is rendered on a semiconductor chip, the area of the semiconductor chip increases and cost increases. If the amplification device is a bipolar transistor, for example, the chip cost per unit area of the first semiconductor chip 101 having the amplification device increases because the manufacturing process is complex, and the chip cost increases even more if a high capacitance device is included. However, because the second semiconductor chip 102 having the switching device costs less than the first semiconductor chip 101, this embodiment of the invention can be achieved at a low cost while rendering the bypass capacitor on the semiconductor chip.

Furthermore, while a dielectric film with a high dielectric constant may be used when a high capacitance is rendered, a process for forming the dielectric film is added to the process of manufacturing the semiconductor device. If the first semiconductor chip 101 has the large differences in elevation when seen in section that are found in a semiconductor device containing bipolar transistors and the dielectric film is formed over the first semiconductor chip 101, the manufacturing process becomes difficult and complex. It is therefore easier and more effective to form this dielectric film on the second semiconductor chip 102 having fewer steps and simpler switching devices.

The reason for rendering capacitor C13 and switching device SW3 is described next.

The bypass capacitor C6 reduces power supply noise and stabilizes amplifier operation. Bypassing a wide frequency band is more effective and a large capacitance is generally better for noise reduction. On the other hand, using the polar effect of modulating the amplifier by imposing a modulation signal on the supply voltage has the disadvantage of limiting the bandwidth of the modulation signal if the capacitance of the bypass capacitor is high. When such polar modulation is used, switching device SW3 is therefore turned off to reduce the capacitance. The switching device SW3 is otherwise on so that the capacitance increases to the sum of capacitances C6 and C13 and the amplifier is stabilized.

The circuit equivalent to capacitor C13 and switching device SW3 can be connected parallel to the bypass capacitor C4 for the power source of the preamplification device, or to both the preamplification and main, amplification stages.

A device or circuit having a memory function, or a device or circuit having a trimming function can be included in the second semiconductor chip 102. One or a plurality of via holes connecting the front and back sides of the chip can also be included in the first semiconductor chip 101 or the second semiconductor chip 102.

Fifth Embodiment

The switching device of the impedance switching circuit included in second semiconductor chip 102 has a capacitance connected to one side in the foregoing embodiment. This fifth embodiment of the invention describes a switching device having a capacitance connected to both sides. In addition, a part of the capacitors included in the second semiconductor chip 102 in the foregoing embodiment is included in the first semiconductor chip 101.

FIG. 15A and FIG. 15B show first and second variations of the high frequency power amplifier according to the present invention. Compared with the first semiconductor chip 101 in FIG. 2, in FIG. 15A and FIG. 15B the first semiconductor chip 101 includes an additional capacitor C20. One side of this capacitor C20 is connected to a node between the second amplifier circuit 108 and the output pin T1 and the other side is to ground. Microstrip lines SL10 and SL11 are formed on the substrate 103.

As described above the high frequency power amplifier 100 is divided into primarily a first semiconductor chip 101 and a second semiconductor chip 102 to achieve a desirable arrangement. In this fifth embodiment of the invention only the input capacitor C7 (shown in FIG. 6A) of the output matching circuit 109 is moved to the first semiconductor chip 101 as capacitor C20. As a result, capacitor C20 can be connected directly to the second amplifier circuit 108 to effectively match the output without adversely affecting the manufacturing process of the first semiconductor chip 101. Furthermore, the amplification device included in the second amplifier circuit 108 has a via hole to ground, and the capacitor C20 can be connected directly to the ground via instead of using a bonding wire. The high power output of the amplification device can therefore flow effectively to ground. By thus first matching the output signal of the amplification device in the first semiconductor chip 101 using the capacitor C20, the size of the output matching circuit 109 can be reduced, and a low loss, wide band output signal can be achieved.

Note that capacitor C20 can be capacitor C8 (see FIG. 6A) or capacitor C9 (see FIG. 6A). In addition, capacitor C20 can include the function of two or more of the three capacitors C7, C8, and C9 in FIG. 6A.

In FIG. 15A the second semiconductor chip 102 includes switch SW4 and capacitors C21, C22, C23, C24, and C25.

Switch SW4 is inserted between capacitor C24 and capacitor C25. Capacitor C24 and capacitor C25 thus block DC flow to switch SW4, and prevent an increase in power consumption and a change in the matching characteristic as a result of DC flow through the capacitors C24 and C25 to the outside. The series circuit having capacitor C24, switch SW4, and capacitor C25 connected in order is parallel connected to the capacitor C22 inserted in series between pin T2 and pin 111. This series circuit decreases or increases the series impedance of the output matching circuit 109 when the control circuit 603 in FIG. 6A turns the switch SW4 on or off, respectively.

In FIG. 15B the second semiconductor chip 102 includes switch SW5 and capacitors C21, C22, C23, C26, and C27. Switch SW5 is inserted between capacitor C26 and capacitor C27. Capacitor C26 and capacitor C27 thus block DC flow to switch SW5, and prevent an increase in power consumption and a change in the matching characteristic as a result of DC flow through the capacitors C26 and C27 to the outside. The series circuit having capacitor C26, switch SW5, and capacitor C27 connected in order is connected with one end inserted between pin T2 and pin 111 and the other end to ground. This series circuit decreases or increases the parallel impedance of the output matching circuit 109 when the control circuit 603 in FIG. 6A turns the switch SW5 on or off, respectively.

Figure 16A:
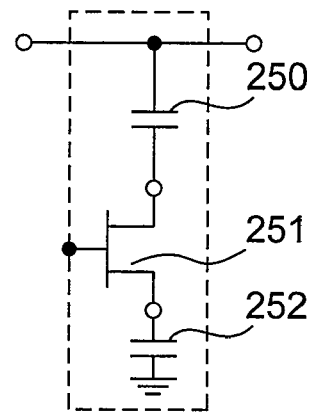
FIG. 16A is a circuit diagram showing an example of an impedance switching circuit that is used in a high frequency power amplifier according to the present invention.
Figure 16B:
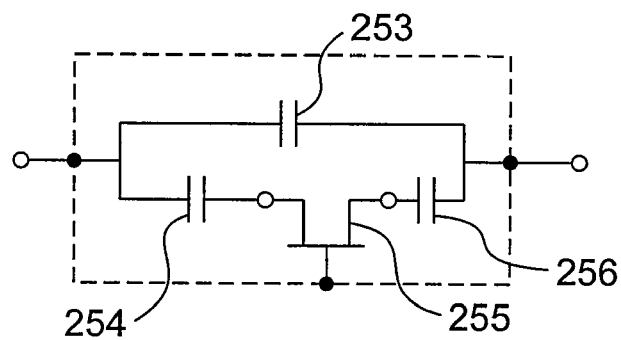
FIG. 16B is a circuit diagram showing an example of an impedance switching circuit that is used in a high frequency power amplifier according to the present invention.
Figure 16C:
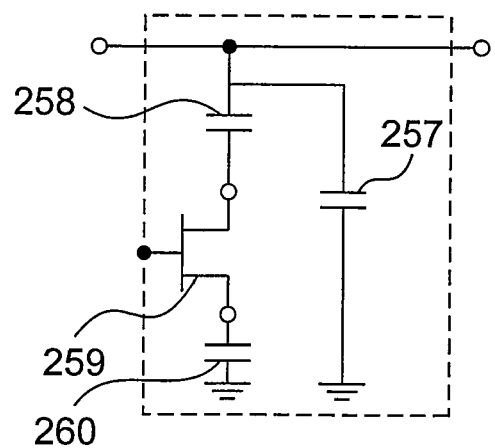
FIG. 16C is a circuit diagram showing an example of an impedance switching circuit that is used in a high frequency power amplifier according to the present invention.

FIG. 16A, FIG. 16B, and FIG. 16C are circuit block diagrams of the impedance switching circuit, and show the switching device inserted between the capacitors in FIG. 10A, FIG. 10B, and FIG. 10C, respectively. More specifically, switching device 251 is inserted between capacitances 250 and 252, switching device 255 is inserted between capacitances 254 and 256, and switching device 259 is inserted between capacitances 258 and 260.

Microstrip lines SL10 and SL11 are formed on the substrate 103 in FIG. 15A and FIG. 15B, but they can be included in the second semiconductor chip 102. Furthermore, the second semiconductor chip 102 is described as part of the output matching circuit 109, but the second semiconductor chip 102 can also include the interstage matching circuit 107.

Sixth Embodiment

Figure 17A:
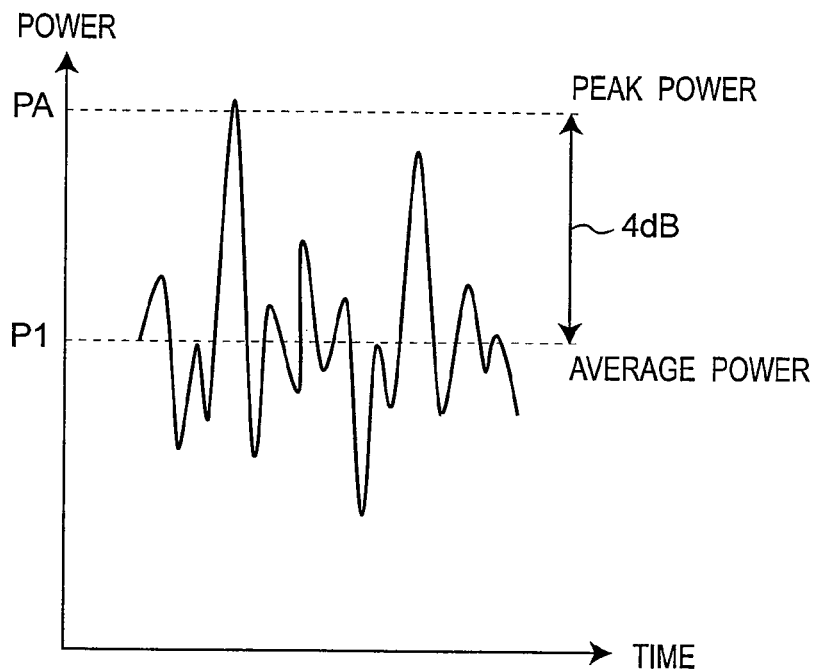
FIG. 17A is a waveform diagram showing the operating wave of a high frequency power amplifier according to the present invention.
Figure 17B:
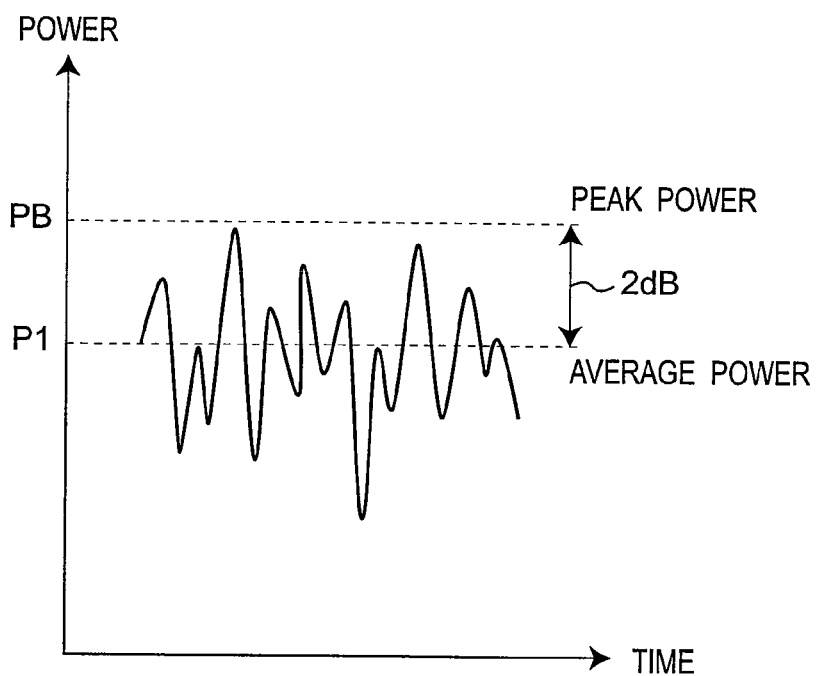
FIG. 17B is a waveform diagram showing the operating wave of a high frequency power amplifier according to the present invention.

FIG. 17A and FIG. 17B are waveform diagrams showing the time change in the output signal power of the amplification device. When the output signal of the amplification device is a CDMA (code division multiple access) or OFDM (orthogonal frequency division multiplexing) signal, the output signal amplitude varies over time. In FIG. 17A the peak power PA of the output signal is approximately 4 dB greater than the average power P1, and in FIG. 17B the peak power PB of the output signal is approximately 2 dB greater than the average power P1.

If distortion can be reduced in the variable amplitude modulation signal output from the amplification device, the SNR of the output signal at the output pin 111 of the output matching circuit 109 can be can be improved and interference with other frequency bands can be reduced. This requires linearly amplifying the input signal to the second amplifier circuit 108 to the peak power level. However, the output efficiency of the second amplifier circuit block 108 drops unless the second amplifier circuit 108 is arranged to linearly amplify the signal to peak power PA as shown in FIG. 17A but only uses the range to peak power PB as shown in FIG. 17B.

Figure 18A:
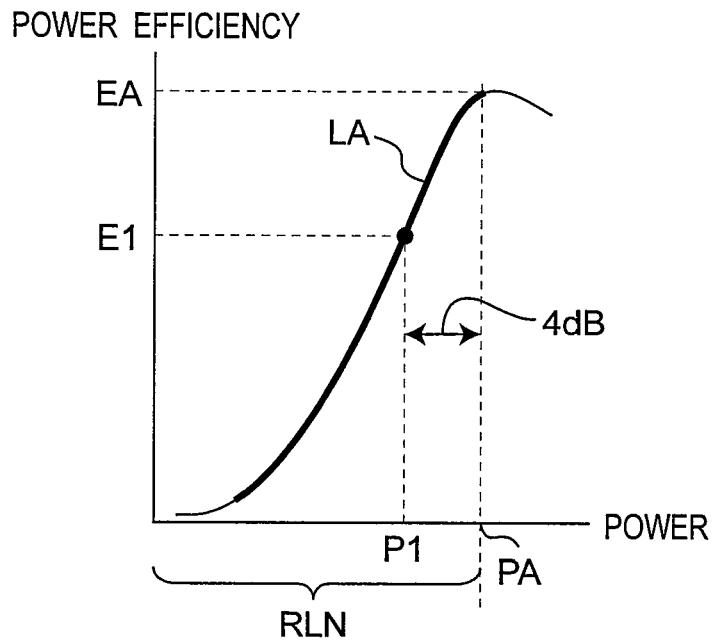
FIG. 18A is a waveform diagram showing the operating wave of a high frequency power amplifier according to the present invention.
Figure 18B:
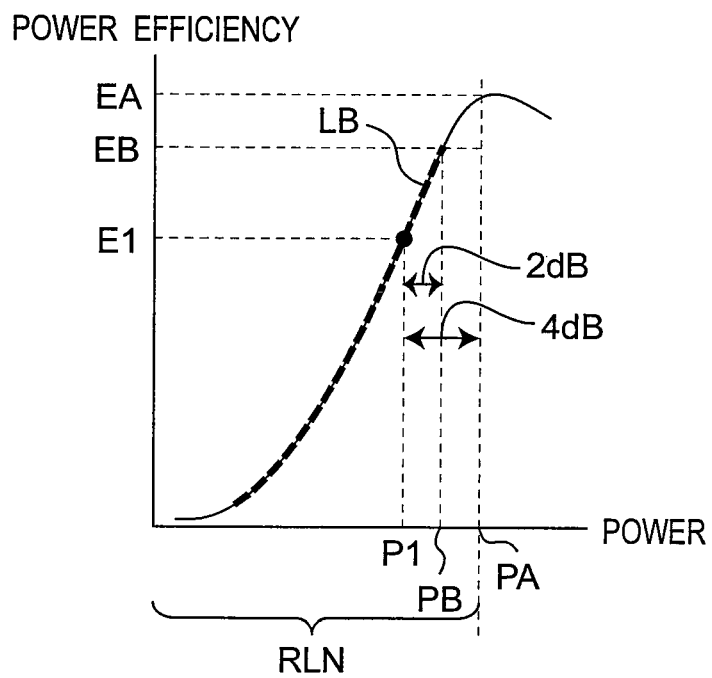
FIG. 18B is a waveform diagram showing the operating wave of a high frequency power amplifier according to the present invention.

FIG. 18A and FIG. 18B show the power efficiency of the same second amplifier circuit 108 when generating the output signals shown in FIG. 17A and FIG. 17B. The operating curve LA denoted by the bold line in FIG. 18A is characterized by average power P1 and the peak power PA at the maximum output power in the linear operating range RLN of the second amplifier circuit 108. The average power efficiency at the average power P1 is E1, and the peak power efficiency at peak power PA is EA. In FIG. 18B the operating curve LB denoted by the bold line is characterized by average power P1 and peak power PB, which is lower than peak power PA. The average power efficiency at average power P1 is E1, and the peak power efficiency at peak power PB is EB, which is lower than EA. The second amplifier circuit 108 is said to be operating in the high peak power mode when it is operating on curve LA, and in the low peak power mode when it is operating on curve LB.

Figure 18C:
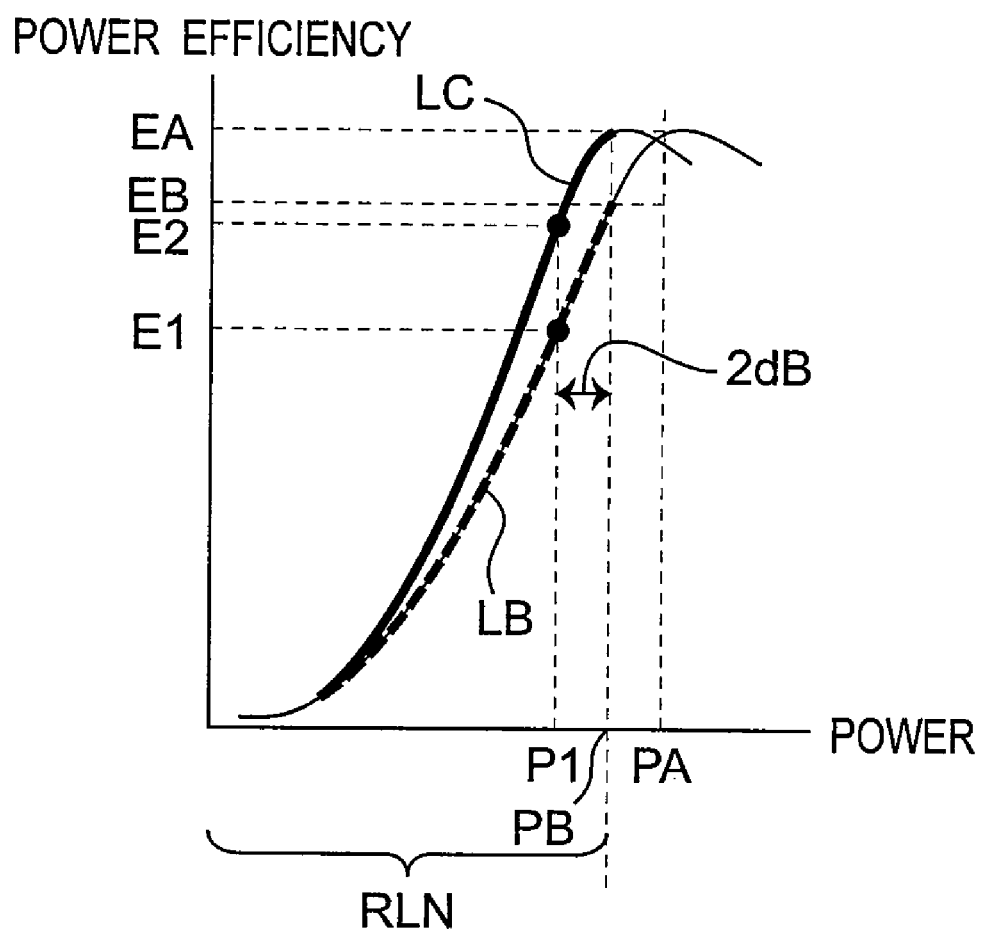
FIG. 18C is a waveform diagram showing the operating wave of a high frequency power amplifier according to the present invention.
Figure 19:
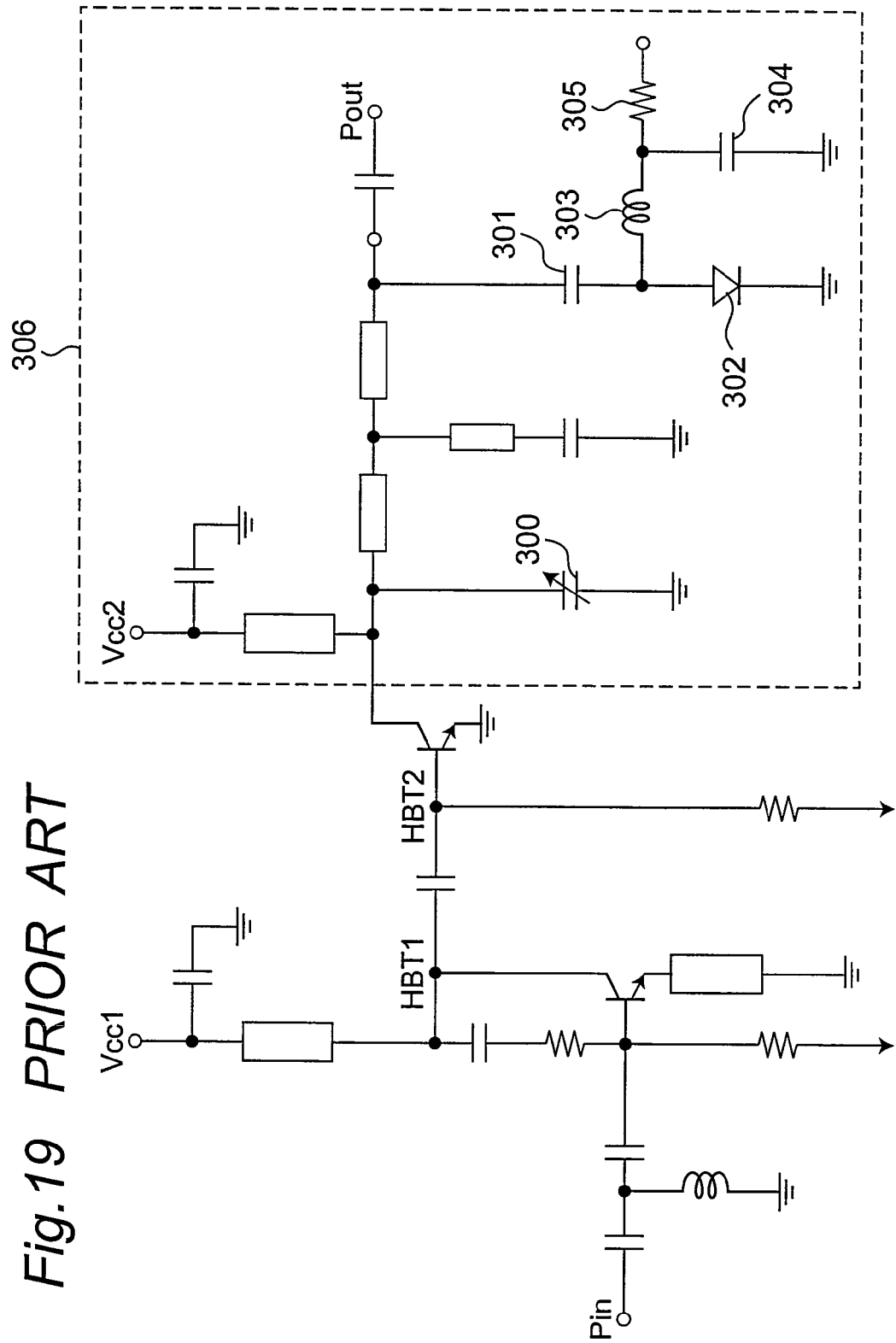
FIG. 19 is a circuit diagram of the prior art.
Figure 20:
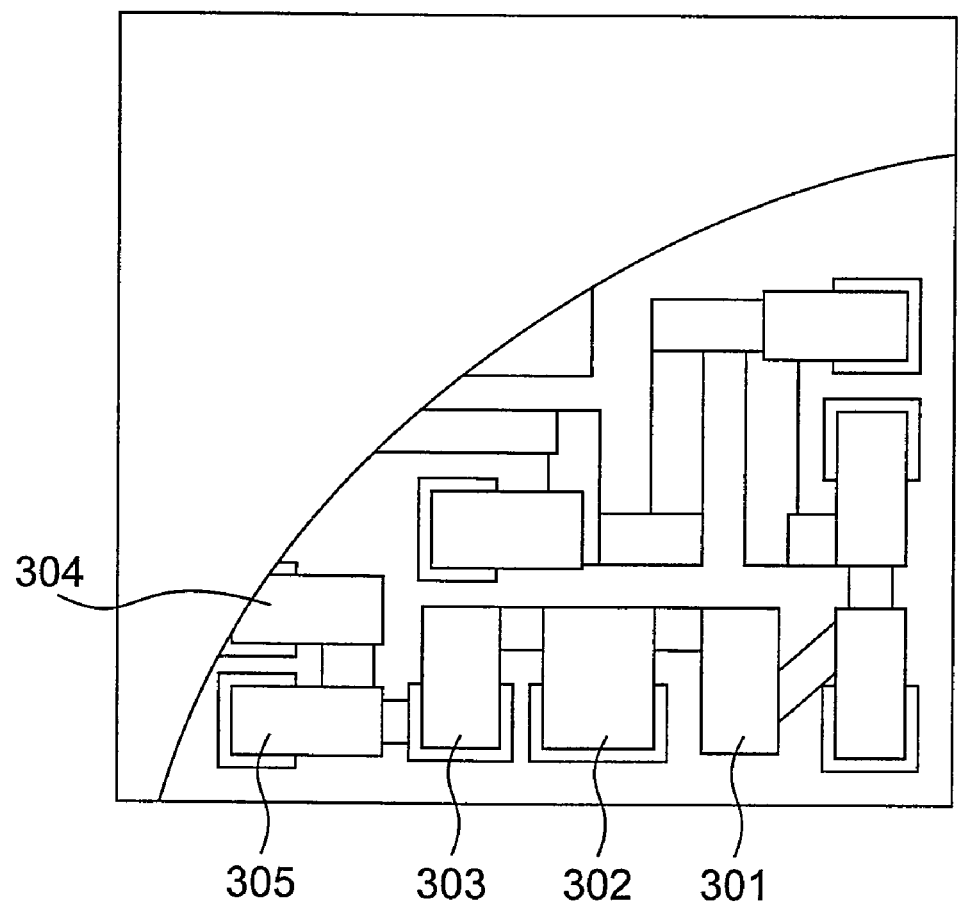
FIG. 20 shows an example of a module according to the prior art.

Because peak power efficiency EB is lower than EA on operating curve LB, the average power efficiency E1 is the same as on operating curve LA even though the peak power PB of the amplification device output signal is low. As indicated by operating curve LC denoted by the bold line in FIG. 18C, if the linear amplification operating range RLN is lowered from less than or equal to peak power PA to less than or equal to peak power PB, and the peak power efficiency at peak power PB is EA, the peak power efficiency at average power P1 goes from E1 to a higher E2, and high power efficiency can be achieved in the second amplifier circuit 108.

This sixth embodiment of the invention changes the switching devices included in the second semiconductor chip 102 according to the peak power of the operating mode, and changes the input impedance to the output matching circuit 109. The switching devices can be the switches shown in any of FIG. 6A, FIG. 6B, FIG. 6E, FIG. 7, FIG. 8, FIG. 9, FIG. 10A, FIG. 10B, FIG. 10C, FIG. 11A, FIG. 11B, FIG. 11C, FIG. 12A, FIG. 12D, FIG. 13A, FIG. 14, FIG. 15A, FIG. 15B, FIG. 16A, and FIG. 16C. The input impedance can therefore be optimized to the peak power of the operating mode, and the power efficiency of the second amplifier circuit 108 can be maximized. The peak power may vary in order to increase the transmission rate even though the modulation method is the same for data communication. The peak power may also vary greatly in a mobile device that is compatible with both W-CDMA (wide band CDMA) and HSDPA (high speed downlink packet access (an expansion of W-CDMA)) when switching between modes. The sixth embodiment of the invention can be effectively used in such cases.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A high frequency power amplifier comprising:
 a first semiconductor chip including a main amplification stage having a first high frequency amplification device; and
 a second semiconductor chip including a main matching stage having a first switching device;
 wherein the main amplification stage has a first output pin operable to output a first signal amplified by the first high frequency amplification device; and
 the main matching stage has a first input pin operable to receive the first signal, and
 a first high frequency matching circuit device operable to match the first signal; and
 the first switching device is any one of a field effect transistor and a heterojunction field effect transistor.

2. The high frequency power amplifier described in claim 1, wherein said first semiconductor chip and said second semiconductor chip are rendered in unison.

3. The high frequency power amplifier described in claim 1, further comprising:
   a substrate on which said first semiconductor chip and said second semiconductor chip are mounted; and
   a high frequency circuit device including a microstrip line formed on the substrate.

4. The high frequency power amplifier described in claim 1, further comprising:
   a substrate on which said first semiconductor chip and said second semiconductor chip are mounted; and
   a passive device mounted on the substrate.

5. The high frequency power amplifier described in claim 1, wherein:
   said second semiconductor chip includes a capacitance; and
   the first switching device is connected to the capacitance.

6. The high frequency power amplifier described in claim 1, wherein:
   said second semiconductor chip includes an inductor; and
   the first switching device is connected to the inductor.

7. The high frequency power amplifier described in claim 1, wherein the first switching device operates as a capacitance when in the off state.

8. The high frequency power amplifier described in claim 1, wherein said second semiconductor chip includes a logic circuit.

9. The high frequency power amplifier described in claim 1, wherein said second semiconductor chip includes a capacitance of 10 pF or greater.

10. The high frequency power amplifier described in claim 1, wherein at least one of said first and second semiconductor chips has a via hole connecting the front and back sides of the semiconductor chip.

11. The high frequency power amplifier described in claim 1, wherein the first high frequency amplification device is a heterojunction bipolar transistor.

12. The high frequency power amplifier described in claim 1, wherein said second semiconductor chip includes at least a part of a supply circuit operable to supply a current or voltage signal supplied to the first high frequency amplification device.

13. The high frequency power amplifier described in claim 1, wherein said first semiconductor chip includes a capacitance connected on one side to the first output pin and on the other side to ground.

* * * * *